US006999360B2

(12) United States Patent
Komura

(10) Patent No.: US 6,999,360 B2
(45) Date of Patent: Feb. 14, 2006

(54) SHIFT REDUNDANCY CIRCUIT, METHOD FOR CONTROLLING SHIFT REDUNDANCY CIRCUIT, AND SEMICONDUCTOR MEMORY DEVICE

(75) Inventor: Kazufumi Komura, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/041,287

(22) Filed: Jan. 25, 2005

(65) Prior Publication Data

US 2005/0122804 A1 Jun. 9, 2005

Related U.S. Application Data

(63) Continuation of application No. PCT/JP2004/001074, filed on Feb. 3, 2004.

(30) Foreign Application Priority Data

Feb. 18, 2003 (JP) .............................. 2003-040220

(51) Int. Cl.
*G11C 7/00* (2006.01)
(52) U.S. Cl. .................................. 365/200; 365/189.12
(58) Field of Classification Search ................ 365/200, 365/189.12, 230.03, 230.06
See application file for complete search history.

(56) References Cited

U.S. PATENT DOCUMENTS 5,768,196 A * 6/1998 Bloker et al. ............... 365/200

6,021,075 A * 2/2000 Ueno ......................... 365/200
6,459,630 B1 * 10/2002 Nakayama et al. ......... 365/200

FOREIGN PATENT DOCUMENTS

| JP | 63-206998 | 8/1988 |
|----|-----------|--------|
| JP | 04-139700 | 5/1992 |
| JP | 04-184798 | 7/1992 |
| JP | 05-028794 | 2/1993 |
| JP | 06-028890 | 2/1994 |
| JP | 06-096597 | 4/1994 |
| JP | 08-008344 | 1/1996 |
| JP | 08-167297 | 6/1996 |
| JP | 08-235893 | 9/1996 |
| JP | 2000-100191 | 4/2000 |
| JP | 2001-006389 | 1/2001 |
| JP | 2001-110196 | 4/2001 |
| JP | 2001-291396 | 10/2001 |

* cited by examiner

Primary Examiner—Anh Phung
(74) Attorney, Agent, or Firm—Arent Fox, PLLC

(57) ABSTRACT

A shift redundancy circuit for enabling switching operation of memory blocks to be executed at a high speed and for reducing current consumption relating to the switching operation. A shift control circuit includes a first shift control circuit for generating a first shift signal corresponding to a first deficiency address of a memory block and a second shift control circuit for generating a second shift signal corresponding to a second deficiency address of a memory block. When the memory blocks are switched, a shift signal controlling the switching of selection line switches are selected from the first shift signal whose state is determined in advance, the second shift signal whose state is determined in advance, and a low potential power supply.

12 Claims, 14 Drawing Sheets

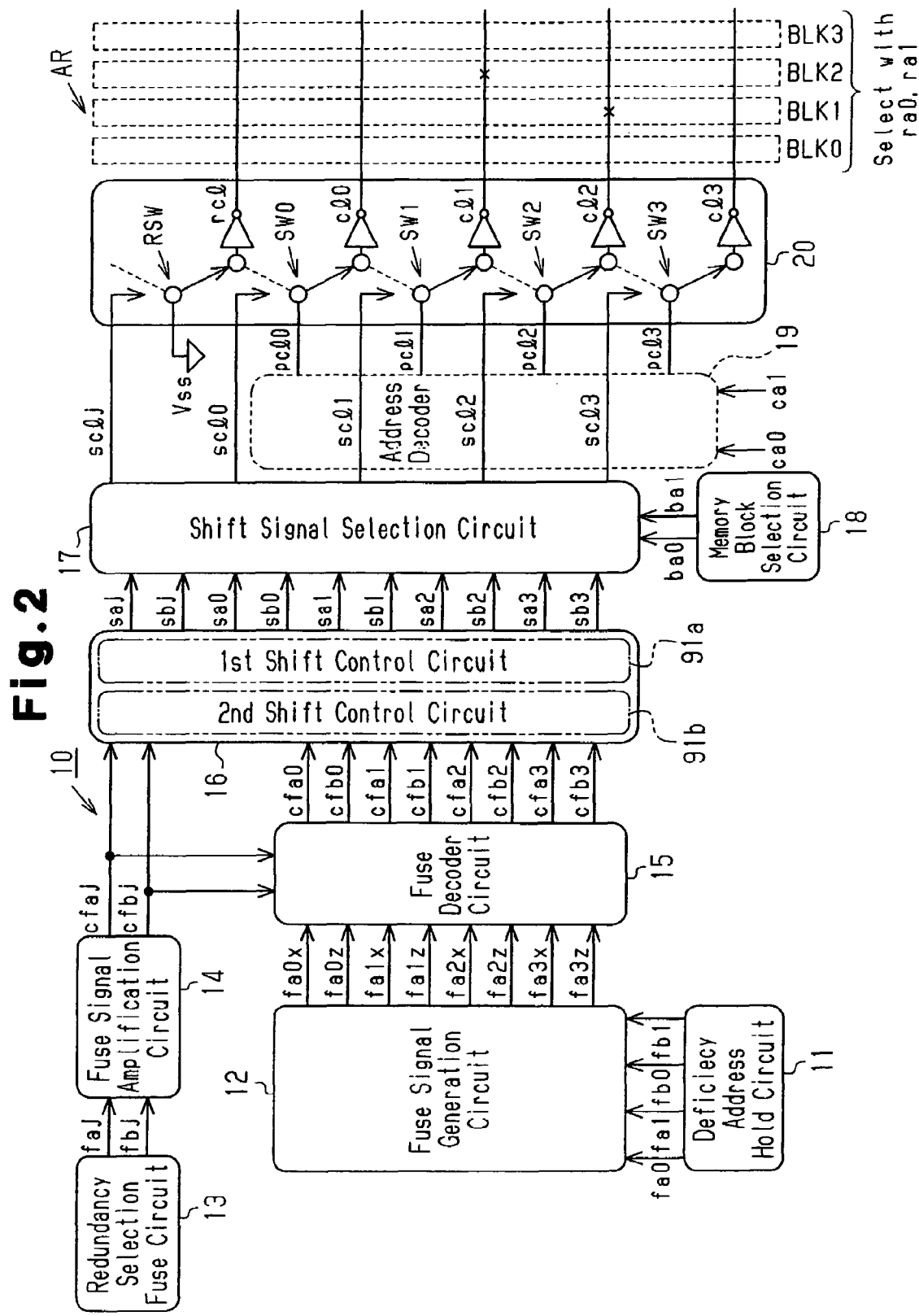

Fig. 6
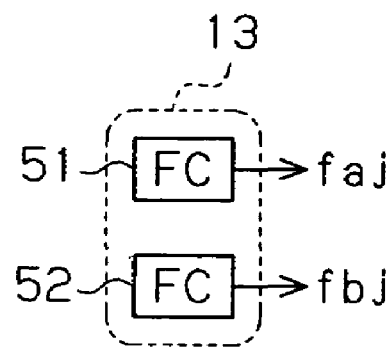
Fig. 7 (a)       Fig. 7 (b)
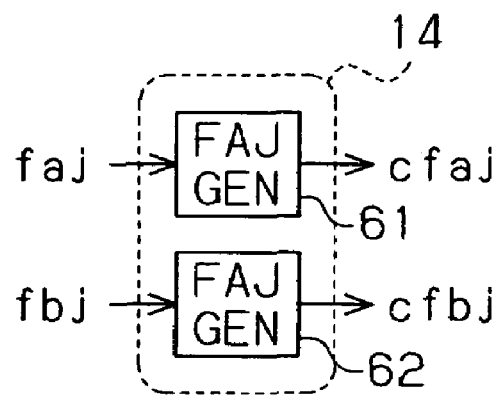    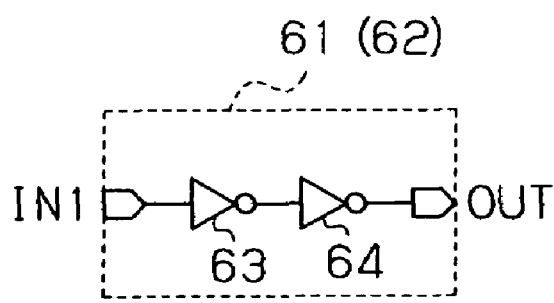

SHIFT REDUNDANCY CIRCUIT, METHOD FOR CONTROLLING SHIFT REDUNDANCY CIRCUIT, AND SEMICONDUCTOR MEMORY DEVICE

CROSS-REFERENCE TO RELATED APPLICATIONS

This application is a continuation of, and claims priority from International Patent Application No. PCT/JP2004/001074, filed on Feb. 3, 2004, the entire contents being incorporated herein by reference.

BACKGROUND OF THE INVENTION

The present invention relates to a shift redundancy circuit, a method for controlling a shift redundancy circuit, and a semiconductor memory device.

For semiconductor memory devices in recent years, demands for miniaturization, larger capacity, and lower power consumption are increasing. As semiconductor memory devices are miniaturized and designed to have larger capacity, deficiencies easily occur in their memories. This leads to a problem of productivity reduction, that is, yield reduction. Redundancy devices play an increasingly larger role in remedying such deficiencies and preventing yield reduction of semiconductor memory devices.

As a conventional redundancy device included in a semiconductor memory device, a shift redundancy circuit is disclosed, for example, in Japanese Laid-Open Patent Publication No. 2000-100191.

FIG. 1 is a block diagram describing an operation principle of a shift redundancy circuit 230. The shift redundancy circuit 230 includes a deficiency address hold circuit 231, a fuse signal generation circuit 232, a redundancy selection fuse circuit 233, a fuse signal amplification circuit 234, a fuse decoder circuit 235, a shift control circuit 236, an address decoder 237, and a selection driver 238.

In FIG. 1, a memory cell array AR is formed by, for example, four memory blocks BLK0 to BLK3. Each of the memory blocks BLK0 to BLK3 is selected based on block address signals ra0 and ra1. Four column selection lines cl0 to cl3 and one redundancy column selection line rcl, which commonly share each of the memory blocks BLK0 to BLK3, are arranged for the memory cell array AR. Further, four pre-column selection lines pcl0 to pcl3 are arranged for the four column selection lines cl0 to cl3.

The pre-column selection lines pcl0 to pcl3 are selected by the address decoder 237, based on column address signals ca0 and ca1. The pre-column selection lines pcl0 to pcl3 are connected, in a switchable manner, to the column selection lines cl0 to cl3 or to the redundancy column selection line rcl and the column selection lines cl0 to cl2, which are at bit positions adjacent to the bit positions of the column selection lines cl0 to cl3, by selection line switches RSW and SW0 to SW3 included in the selection driver 238.

In detail, shift signals sclj and scl0 to scl3 are respectively input into the selection line switches RSW and SW0 to SW3 from the shift control circuit 236, which will be described later. The pre-column selection lines pcl0 to pcl3 are connected, in a switchable manner, to the column selection lines cl0 to cl3, or to the redundancy column selection line rcl and the column selection lines cl0 to cl2, by the selection line switches SW0 to SW3 into which the corresponding shift signals scl0 to scl3 are input.

In the present example, when low (L) level shift signals scl0 to scl3 are respectively input into the selection line switches SW0 to SW3, the pre-column selection lines pcl0 to pcl3 are connected to the column selection lines cl0 to cl3. When high (H) level shift signals scl0 to scl3 are respectively input into the selection line switches SW0 to SW3, the pre-column selection lines pcl0 to pcl3 are connected to the redundancy column selection line rcl and the column selection lines cl0 to cl2.

When the pre-column selection line pcl0 is not connected to the redundancy column selection line rcl, the redundancy column selection line rcl is clamped to a low potential power supply Vss (e.g., to ground potential) by the selection line switch RSW into which an L level shift signal sclj is input.

The deficiency address hold circuit 231 includes a plurality of fuse circuits (not shown) for holding, when any of the memory blocks BLK0 to BLK3 includes a memory cell having a deficiency, an address selecting the memory cell as a deficiency address.

For example, as shown in FIG. 1, when the memory block BLK1 includes a memory cell having a first deficiency and the memory block BLK2 includes a memory cell having a second deficiency, the deficiency address hold circuit 231 holds a first deficiency address corresponding to the first deficiency and a second deficiency address corresponding to the second deficiency. To be specific, the deficiency address hold circuit 231 outputs address signals fa0 and fa1 indicating the first deficiency address, and address signals fb0 and fb1 indicating the second deficiency address.

The address signals fa0, fa1, fb0, and fb1, which are output from the deficiency address hold circuit 231, are complemented by the fuse signal generation circuit 232, and are generated as fuse signals fa0$x$, fa0$z$, fa1$x$, fa1$z$, fb0$x$, fb0$z$, fb1$x$, and fb1$z$, respectively.

When the memory blocks BLK1 and BLK2 are selected, the redundancy selection fuse circuit 233 outputs redundancy selection signals faj and fbj for respectively remedying the first deficiency and the second deficiency, in response to memory block selection signals ba0 and ba1 from a memory block selection circuit, which is not shown.

The redundancy selection signals faj and fbj, which are output from the redundancy selection fuse circuit 233, are amplified by the fuse signal amplification circuit 234, and are generated as fuse signals cfaj and cfbj, respectively.

The fuse decoder circuit 235 decodes the fuse signals fa0$x$, fa0$z$, fa1$x$, fa1$z$, fb0$x$, fb0$z$, fb1$x$, and fb1$z$, which are output from the fuse signal generation circuit 232, and the fuse signals cfaj and cfbj, which are output from the fuse signal amplification circuit 234, to generate decode signals cfj and cf0 to cf3, respectively.

The shift control circuit 236 generates shift signals sclj and scl0 to csl3 for controlling the switching of the selection line switches RSW and SW0 to SW3 based on the decode signals cfj and cf0 to cf3, which are output from the fuse decoder circuit 235.

The following describes the operation of the shift redundancy circuit 230 with the above-described structure.

When the memory block BLK0 is selected, the memory block selection signals ba0 and ba1 are both set at an L level because the memory block BLK0 has no deficiency, and the redundancy selection signals faj and fbj are both set at an L level.

In this state, the shift control circuit 236 generates L level shift signals sclj and scl0 to scl3 in response to the decode signals cfj and cf0 to cf3 output from the fuse decoder circuit 235.

Thus, the pre-column selection lines pcl0 to pcl3 are connected to the column selection lines cl0 to cl3 by the selection line switches SW0 to SW3, respectively. The redundancy column selection line rcl is clamped to ground potential by the selection line switch RSW.

When the memory block BLK1 is selected, the memory block selection signal ba0 is set at an H level and the memory block selection signal ba1 is set at an L level because the memory block BLK1 has a first deficiency. Thus, the redundancy selection signal faj is set at an H level and the redundancy selection signal fbj is set at an L level.

In this state, the shift control circuit 236 generates H level shift signals sclj and scl0 to scl2 and an L level shift signal scl3 in response to the decode signals cfj and cf0 to cf3 output from the fuse decoder circuit 235.

Thus, the pre-column selection lines pcl0 to pcl2 are connected to the redundancy column selection line rcl and the column selection lines cl0 and cl1 by the selection line switches. SW0 to SW2, respectively. The pre-column selection line pcl3 is connected to the column selection line cl3 by the selection line switch SW3. The column selection line cl2 is not selected (connected to neither the pre-column selection line pcl2 nor pcl3).

When the memory block BLK2 is selected, the memory block selection signal ba0 is set at an L level and the memory block selection signal ba1 is set at an H level because the memory block BLK2 has a second deficiency. Thus, the redundancy selection signal faj is set at an L level and the redundancy selection signal fbj is set at an H level.

In this state, the shift control circuit 236 generates H level shift signals sclj, scl0, and scl1, and L level shift signals scl2 and scl3 in response to the decode signals cfj and cf0 to cf3 output from the fuse decoder circuit 235.

Thus, the pre-column selection lines pcl0 and pcl1 are connected to the redundancy column selection line rcl and the column selection line cl0 by the selection line switches SW0 and SW1, respectively. The pre-column selection lines pcl2 and pcl3 are connected to the column selection lines cl2 and cl3 by the selection line switches SW2 and SW3, respectively. The column selection line cl1 is not selected (connected to neither the pre-column selection line pcl1 nor pcl2).

When the memory block BLK3 is selected, the shift control circuit 236 generates L level shift signals sclj and scl0 to scl3 in the same manner as when the memory block BLK0 described above is selected because the memory block BLK3 has no deficiency. Thus, the pre-column selection lines pcl0 to pcl3 are connected to the column selection lines cl0 to cl3 by the selection line switches SW0 to SW3, respectively. The redundancy selection line rcl is clamped to ground potential by the selection line switch RSW.

In this way, in the shift redundancy circuit 230, the shift control circuit 236 operates according to the redundancy selection signals faj and fbj, which are generated based on the memory block selection signals ba0 and ba1. Then, the switching of the selection line switches RSW and SW0 to SW3 is controlled according to the shift signals sclj and scl0 to scl3, which are generated by the shift control circuit 236.

As a result, when the memory block BLK1 is selected, connection destinations of the pre-column selection lines pcl0 to pcl2 are switched to be sequentially shifted from the column selection lines cl0 to cl2 to the redundancy column selection line rcl and the column selection lines cl0 and cl1, which are at bit positions adjacent to the bit positions of the column selection lines cl0 to cl2. This switching realizes the memory block BLK1 with no deficiency.

Also, when the memory block BLK2 is selected, connection destinations of the pre-column selection lines pcl0 and pcl1 are switched to be sequentially shifted from the column selection lines cl0 and cl1 to the redundancy column selection line rcl and the column selection line cl0, which are at bit positions adjacent to the bit positions of the column selection lines cl0 and cl1. This switching realizes the memory block BLK2 with no deficiency.

With the conventional structure described above, the shift control circuit 236 operates to change the states of the shift signals sclj and scl0 to scl3 every time when the memory blocks BLK0 to BLK3 that are selected are switched. Then, the selection line switches RSW and SW0 to SW3 are switched based on those shift signals. This slows the switching of the selection line switches RSW and SW0 to SW3. As a result, the switching of the memory blocks BLK0 to BLK3 fails to be executed at a high speed.

Further, the shift control circuit 236 operates every time when the memory blocks BLK0 to BLK3 are switched. This increases the operation current of the shift control circuit 236, and thereby increases power consumption.

Accordingly, it is an object of the present invention to provide a shift redundancy circuit, a method for controlling the shift redundancy circuit, and a semiconductor memory device that enable a switching operation of memory blocks to be executed at a high speed and reduce current consumption relating to the switching operation.

SUMMARY OF THE INVENTION

One aspect of the present invention is a method for controlling a shift redundancy circuit that selectively connects a plurality of selection lines and at least one redundancy selection line, each of which commonly shares a plurality of memory blocks, to a plurality of decode selection lines, and remedies a deficiency relating to each of the plurality of selection lines for each memory block. The method includes the steps of decoding a deficiency address indicating a deficient location to generate a decode signal, generating a shift signal for determining the plurality of decode selection lines to be selectively connected to the plurality of selection lines and the at least one redundancy selection line based on the decode signal for each memory block having a deficiency to be remedied, selecting a shift signal corresponding to a selected memory block having a deficiency to be remedied based on a memory block selection signal, and selectively connecting the plurality of decode selection lines to the plurality of selection lines and the at least one redundancy selection line based on the selected shift signal.

A further aspect of the present invention is a method for controlling a shift redundancy circuit that selectively connects a plurality of selection lines and at least one redundancy selection line, each of which commonly shares a plurality of memory blocks, to a plurality of decode selection lines, and remedies a deficiency relating to each of the plurality of selection lines for each memory block. The method includes the step of generating a decode signal by decoding a deficiency address indicating a deficient location in response to a set signal. Another step is generating and holding, individually for each memory block having a deficiency to be remedied, a shift signal for determining the plurality of decode selection lines that are to be selectively connected to the plurality of selection lines and the at least one redundancy selection line based on the decode signal. A further step is selecting a held shift signal that corresponds to a selected memory block having a deficiency to be remedied, based on a memory block selection signal. The method also includes the step of selectively connecting the plurality of decode selection lines to the plurality of selection lines and the at least one redundancy selection line based on the selected shift signal.

Another aspect of the present invention is a shift redundancy circuit for selectively connecting a plurality of selection lines and at least one redundancy selection line, each of which commonly shares a plurality of memory blocks, to a plurality of decode selection lines, and remedying a deficiency relating to each of the plurality of selection lines for each memory block. The circuit includes a shift control circuit for generating a shift signal for determining the plurality of decode selection lines to be selectively connected to the plurality of selection lines and the at least one redundancy selection line based on a deficiency address indicating a deficient location and a redundancy selection signal for selecting the redundancy selection line for each memory block having a deficiency to be remedied. A shift signal selection circuit, connected to the shift control circuit, selects a shift signal corresponding to a selected memory block having a deficiency to be remedied based on a memory block selection signal. A switch circuit, connected to the shift signal selection circuit, selectively connects the plurality of decode selection lines to the plurality of selection lines and the at least one redundancy selection line based on the shift signal selected by the shift signal selection circuit.

A further aspect of the present invention is a shift redundancy circuit for selectively connecting a plurality of selection lines and at least one redundancy selection line, each of which commonly shares a plurality of memory blocks, to a plurality of decode selection lines, and remedying a deficiency relating to each of the plurality of selection lines for each memory block. The circuit includes a shift control circuit for generating a shift signal for determining the plurality of decode selection lines to be selectively connected to the plurality of selection lines and the at least one redundancy selection line based on a deficiency address indicating a deficient location and a redundancy selection signal for selecting the redundancy selection line. A shift information selection circuit, connected to the shift control circuit, outputs a shift signal selected by the shift control circuit, based on a set signal, for each memory block having a deficiency to be remedied. A shift information latch circuit, connected to the shift information selection circuit, latches a shift signal output from the shift information selection circuit. A shift signal selection circuit, connected to the information latch circuit, selects a shift signal corresponding to a selected memory block having a deficiency to be remedied and latched by the shift information latch circuit, based on a memory block selection signal. A switch circuit, connected to the shift signal selection circuit, selectively connects a plurality of decode selection lines to the plurality of selection lines and the at least one redundancy selection line based on the shift signal selected by the shift signal selection circuit.

Another aspect of the present invention is a semiconductor memory device including a plurality of memory blocks. The semiconductor memory device further includes a plurality of selection lines and at least one redundancy selection line, each of which commonly shares the plurality of memory blocks. Further, the semiconductor memory device includes a plurality of decode selection lines. A shift redundancy circuit selectively connects the plurality of selection lines and the at least one redundancy selection line to the plurality of decode selection lines, and remedies a deficiency relating to each of the plurality of selection lines for each memory block. The shift redundancy circuit includes a shift control circuit for generating, for each memory block having a deficiency to be remedied, a shift signal for determining the plurality of decode selection lines to be selectively connected to the plurality of selection lines and the at least one redundancy selection line based on a deficiency address indicating a deficient location and a redundancy selection signal for selecting the redundancy selection line. A shift signal selection circuit, connected to the shift control circuit, selects a shift signal corresponding to a selected memory block having a deficiency to be remedied based on a memory block selection signal. A switch circuit, connected to the shift signal selection circuit, selectively connects the plurality of decode selection lines to the plurality of selection lines and the at least one redundancy selection line based on the shift signal selected by the shift signal selection circuit.

A further aspect of the present invention is a semiconductor memory device including a plurality of memory blocks. The semiconductor memory device also includes a plurality of selection lines and at least one redundancy selection line, each of which commonly shares the plurality of memory blocks. Further, the semiconductor memory device includes a plurality of decode selection lines. A shift redundancy circuit selectively connects the plurality of selection lines and the at least one redundancy selection line to the plurality of decode selection lines, and remedies a deficiency relating to each of the plurality of selection lines for each memory block. The shift redundancy circuit includes a shift control circuit for generating a shift signal for determining and controlling switching of connection destinations of the plurality of decode selection lines to be selectively connected to the plurality of selection lines and the at least one redundancy selection line based on a deficiency address indicating a deficient location and a redundancy selection signal for selecting the redundancy selection line. A shift information selection circuit, connected to the shift control circuit, outputs a selected shift signal that is generated by the shift control circuit based on a set signal for each memory block having a deficiency to be remedied. A shift information latch circuit, connected to the shift information selection circuit, latches a shift signal output from the shift information selection circuit. A shift signal selection circuit, connected to the information latch circuit, selects, when a memory block having a deficiency to be remedied is selected, a shift signal that corresponds to the selected memory block and that is latched in advance by the shift information latch circuit, based on a memory block selection signal. A switch circuit, connected to the shift signal selection circuit, changes a connection destination of at least one of the plurality of decode selection lines, and selectively connects the plurality of decode selection lines to the plurality of selection lines and the at least one redundancy selection line so that the connection destinations of the plurality of decode selection lines are shifted based on the shift signal selected by the shift signal selection circuit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 2 is a schematic block diagram showing a shift redundancy circuit according to a first embodiment of the present invention;

FIG. 6 is a schematic circuit diagram showing a redundancy selection fuse circuit;

FIG. 7(a) is a schematic circuit diagram showing a fuse signal amplification circuit, and FIG. 7(b) is a circuit diagram of an FAJGEN;

DETAILED DESCRIPTION OF THE PREFERRED EMBODIMENT

First Embodiment

Figure 1:
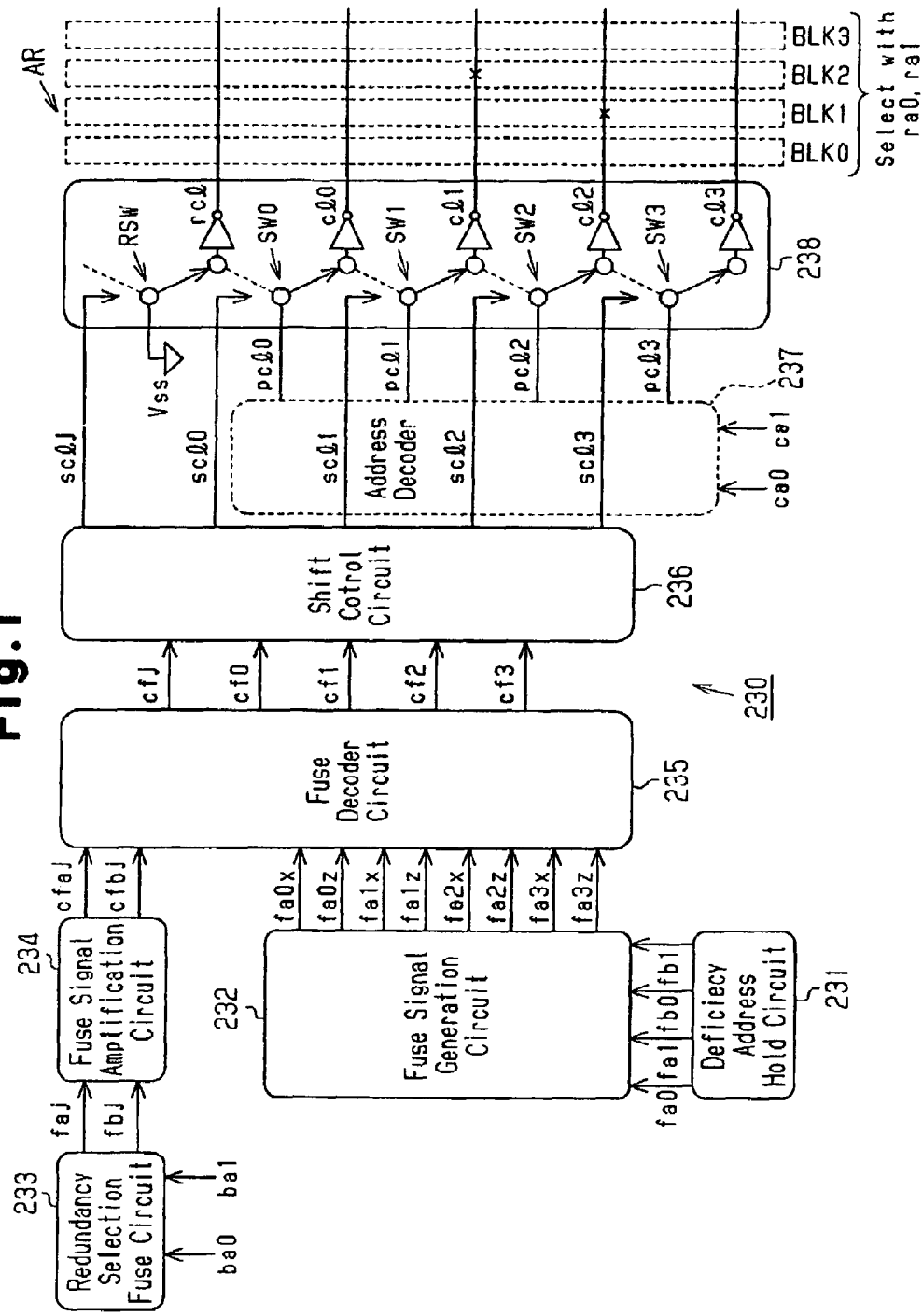
FIG. 1 is a schematic block diagram showing a conventional shift redundancy circuit.

A shift redundancy circuit included in a semiconductor memory device according to a first embodiment of the present invention will now be described with reference to FIGS. 2 to 11b. In the present embodiment, like or same reference numerals are given to those components that are the same or similar in the prior art example of FIG. 1.

FIG. 2 is a schematic block diagram showing a shift redundancy circuit according to the first embodiment.

The shift redundancy circuit 10 includes a deficiency address hold circuit 11, a fuse signal generation circuit 12, a redundancy selection fuse circuit 13 (redundancy selection signal generation circuit), a fuse signal amplification circuit 14, a fuse decoder circuit 15, a shift control circuit 16, a shift signal selection circuit 17, a memory block selection circuit 18, an address decoder 19, and a selection driver 20.

In the first embodiment, a memory cell array AR is formed by, for example, four memory blocks BLK0 to BLK3. Each of the memory blocks BLK0 to BLK3 is selected based on block address signals ra0 and ra1.

The memory blocks BLK0 to BLK3 may be memory blocks that are controlled exclusively (e.g., low blocks, column blocks, etc.) or may be memory blocks that are not controlled exclusively (e.g., banks, etc.). In the present embodiment, flexible redundancy (also referred to as "column redundancy") is described assuming that the memory blocks BLK0 to BLK3 are low blocks.

Four column selection lines cl0 to cl3 and one redundancy column selection line rcl, which commonly share each of the memory blocks BLK0 to BLK3, are arranged for the memory cell array AR. Further, four pre-column selection lines pcl0 to pcl3 as decode selection lines are arranged for the four column selection lines cl0 to cl3, respectively.

Figure 3B:
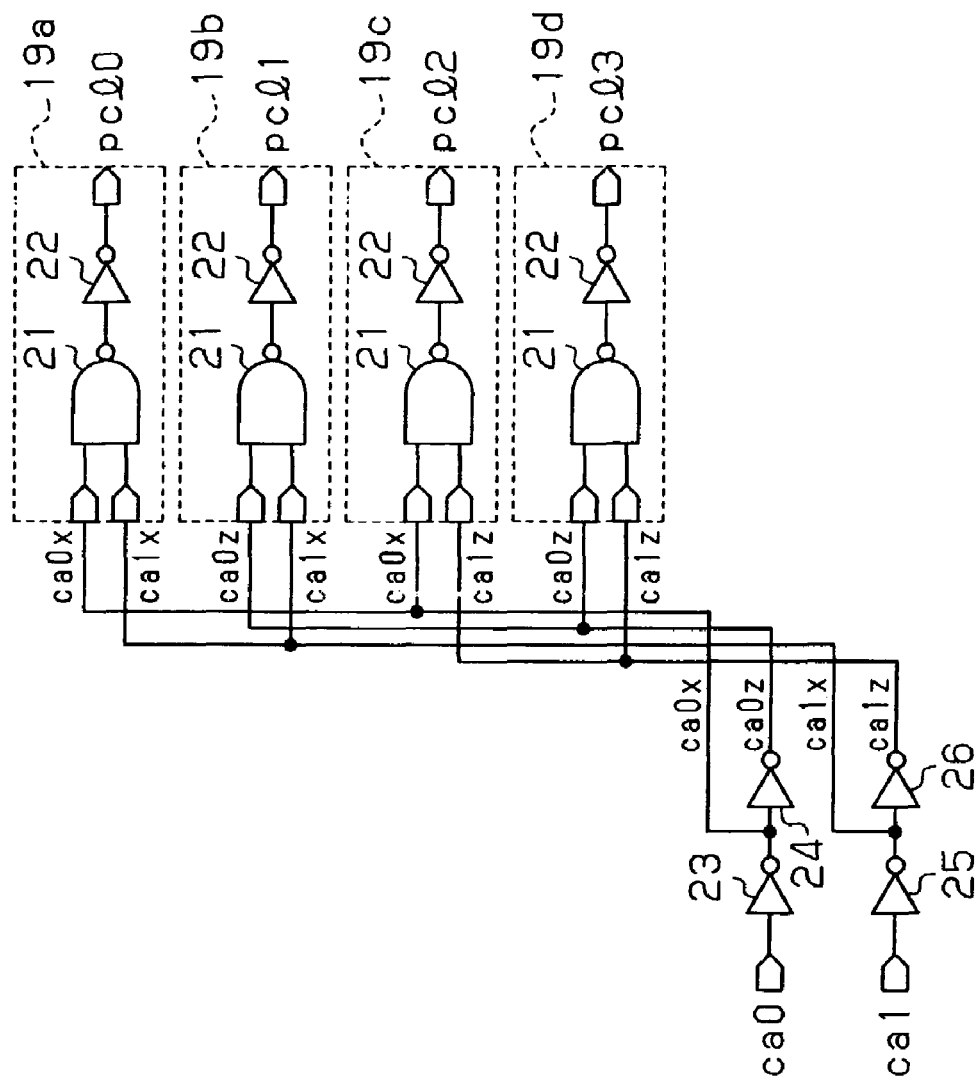
FIG. 3(b) is a circuit diagram showing the address decoder.
Figure 3A:
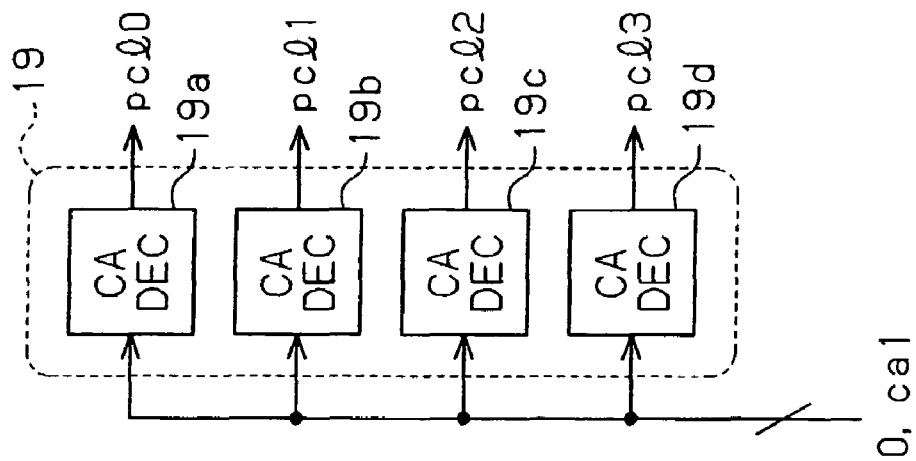
FIG. 3(a) is a schematic circuit diagram showing an address decoder.

The pre-column selection lines pcl0 to pcl3 are selected by the address decoder 19 based on column address signals ca0 and ca1. As shown in FIG. 3(a), the address decoder 19 includes CADECs 19a to 19d as column address decoders. Each of the CADECs 19a to 19d includes a NAND circuit 21 and an inverter circuit 22 as shown in FIG. 3(b).

The column address signals ca0 and ca1 are complemented by inverter circuits 23 and 24 and inverter circuits 25 and 26, and are generated as address signals ca0x and ca0z and address signals ca1x and ca1z, respectively. The address signals ca0x, ca0z, ca1x, and ca1z are decoded by the CADECs 19a to 19d so that one of the pre-column selection lines pcl0 to pcl3 is selected.

The pre-column selection lines pcl0 to pcl3 are connected, in a switchable manner, to the column selection lines cl0 to cl3 or to the redundancy column selection line rcl and the column selection lines cl0 to cl2, which are at bit positions adjacent to the bit positions of the column selection lines cl0 to cl3, by selection line switches RSW and SW0 to SW3 as switch circuits included in the selection driver 20. The selection line switch RSW is a redundancy selection line switch arranged in correspondence with the redundancy column selection line rcl.

In detail, shift signals sclj and scl0 to scl3 for switching the switches are respectively input into the selection line switches RSW and SW0 to SW3 from the shift signal selection circuit 17, which will be described later. The pre-column selection lines pcl0 to pcl3 are connected, in a switchable manner, to the column selection lines cl0 to cl3 or to the redundancy column selection line rcl and the column selection lines cl0 to cl2 by the selection line switches SW0 to SW3, into which the corresponding shift signals scl0 to scl3 are input.

In the first embodiment, when L level shift signals scl0 to scl3 are respectively input into the selection line switches SW0 to SW3, the pre-column selection lines pcl0 to pcl3 are connected to the column selection lines cl0 to cl3. When H level shift signals scl0 to scl3 are respectively input into the selection line switches SW0 to SW3, the pre-column selection lines pcl0 to pcl3 are connected to the redundancy column selection line rcl and the column selection lines cl0 to cl2.

When the pre-column selection line pcl0 is not connected to the redundancy column selection line rcl, the redundancy column selection line rcl is clamped to a low-potential power supply Vss (e.g., to ground potential) by the selection line switch RSW into which an L level shift signal sclj is input.

The deficiency address hold circuit 11 holds, when any of the memory blocks BLK0 to BLK3 includes a memory cell having a deficiency, an address selecting the memory cell as a deficiency address. As shown in FIG. 2, for example, the following describes a case in which the memory block BLK1 includes a memory cell having a first deficiency and the memory block BLK2 includes a memory cell having a second deficiency.

Figure 4A:
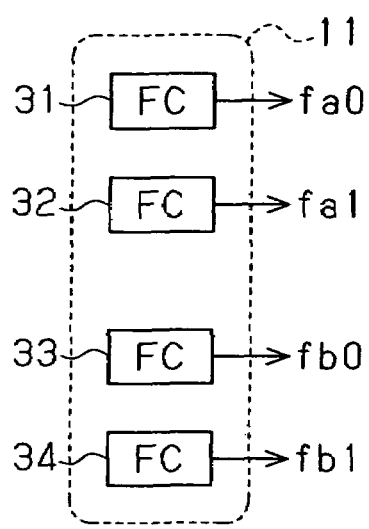
FIG. 4(a) is a schematic circuit diagram showing a deficiency address hold circuit.

FIG. 4(a) is a schematic circuit diagram showing the deficiency address hold circuit 11.

As shown in FIG. 4(a), the deficiency address hold circuit 11 includes fuse circuits (FCs) 31 and 32 holding a first deficiency address corresponding to the first deficiency, and fuse circuits (FCs) 33 and 34 holding a second deficiency address corresponding to the second deficiency. To be specific, the fuse circuits 31 and 32 respectively hold address signals fa0 and fa1 indicating the first deficiency address. The fuse circuits 33 and 34 respectively hold address signals fb0 and fb1 indicating the second deficiency address.

Figure 4B:
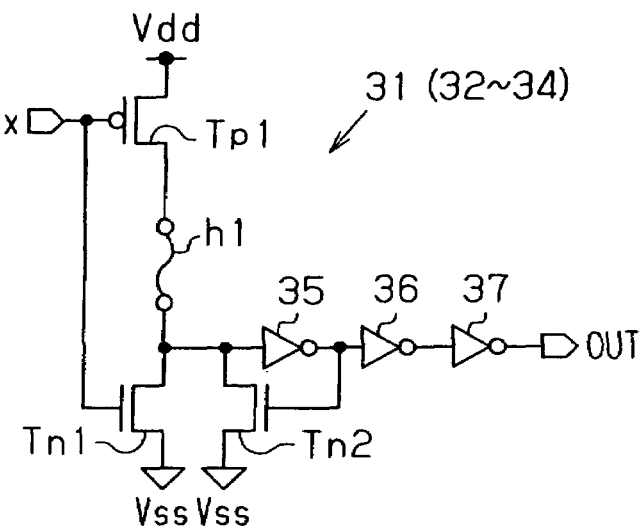
FIG. 4(b) is a circuit diagram of a fuse circuit.

As shown in FIG. 4(b), each of the fuse circuits 31 to 34 includes a p-channel MOS (metal oxide semiconductor) transistor (hereafter referred to as a "PMOS transistor") Tp1, n-channel MOS transistors (hereafter referred to as "NMOS transistors") Tn1 and Tn2, a fuse h1, and inverter circuits 35 to 37.

The fuse circuits 31 to 34 respectively output L level address signals fa0, fa1, fb0, and fb1 (OUT) when a start signal sttx is at an H level. Afterward, when the start signal sttx shifts to an L level, the fuse circuits 31 to 34 output H level address signals fa0, fa1, fb0, and fb1 (OUT) if the fuse h1 is disconnected, and output L level address signals fa0, fa1, fb0, and fb1 (OUT) if the fuse h1 is not disconnected.

In the first embodiment, in correspondence with the first deficiency address, an L level address signal fa0 is output from the fuse circuit 31 and an H level address signal fa1 is output from the fuse circuit 32. In correspondence with the second deficiency address, an H level address signal fb0 is output from the fuse circuit 33 and an L level address signal fb1 is output from the fuse circuit 34.

The address signals fa0, fa1, fb0, and fb1, which are output from the deficiency address hold circuit 11, are complemented by the fuse signal generation circuit 12 and are generated as fuse signals fa0x, fa0z, fa1x, fa1z, fb0x, fb0z, fb1x, and fb1z, respectively.

Figure 5A:
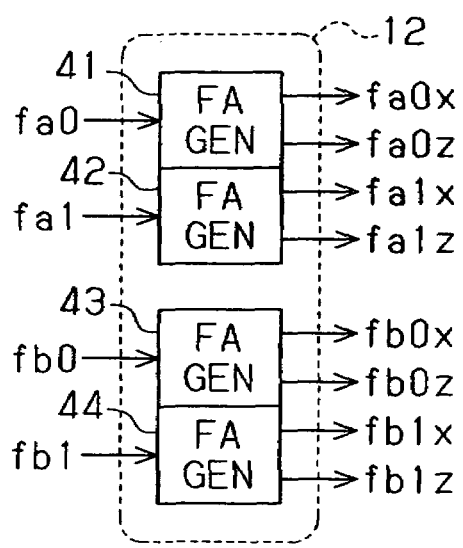
FIG. 5(a) is a schematic circuit diagram showing a fuse signal generation circuit.

FIG. 5(a) is a schematic circuit diagram showing the fuse signal generation circuit 12.

Figure 5B:
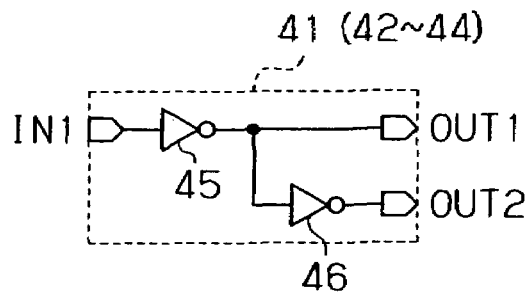
FIG. 5(b) is a circuit diagram of an FAGEN.

As shown in FIG. 5(a), the fuse signal generation circuit 12 includes FAGENs 41 to 44 as fuse signal generators. Referring to FIG. 5(b), each of the FAGENs 41 to 44 includes inverter circuits 45 and 46. The FAGENs 41 to 44 respectively generate fuse signals fa0x, fa1x, fb0x, and fb1x (OUT1) and fuse signals fa0z, fa1z, fb0z, and fb1z (OUT2), which are complementary to each other, based on the corresponding address signals fa0, fa1, fb0, and fb1 (IN1).

FIG. 6 is a circuit diagram showing the redundancy selection fuse circuit 13.

The redundancy selection fuse circuit 13 includes a fuse circuit (FC) 51 holding a first redundancy selection signal faj corresponding to the first deficiency of the memory block BLK1, and a fuse circuit (FC) 52 holding a second redundancy selection signal fbj corresponding to the second deficiency of the memory block BLK2.

Each of the fuse circuits 51 and 52 has the same structure as that shown in FIG. 4(b). The fuse circuits 51 and 52 respectively set the first and second redundancy selection signals faj and fbj active (at an H level) based on an H level start signal sttx.

The redundancy selection signals faj and fbj, which are output from the redundancy selection fuse circuit 13, are amplified by the fuse signal amplification circuit 14, and are generated as fuse signals cfaj and cfbj, respectively.

FIG. 7(a) is a schematic circuit diagram showing the fuse signal amplification circuit 14.

As shown in FIG. 7(a), the fuse signal amplification circuit 14 includes FAJGENs 61 and 62 as fuse signal amplifiers. As shown in FIG. 7(b), each of the FAJGENs 61 and 62 includes inverter circuits 63 and 64. The FAJGENs 61 and 62 amplify the corresponding redundancy selection signals faj and fbj (IN1) via the inverter circuits 63 and 64 to generate fuse signals cfaj and cfbj (OUT).

The fuse decoder circuit 15 decodes the fuse signals fa0x, fa0z, fa1x, fa1z, fb0x, fb0z, fb1x, and fb1z, which are output from the fuse signal generation circuit 12, and the fuse signals cfaj and cfbj, which are output from the fuse signal amplification circuit 14, to generate decode signals cfa0, cfb0, cfa1, cfb1, cfa2, cfb2, cfa3, and cfb3, respectively.

Figure 8A:
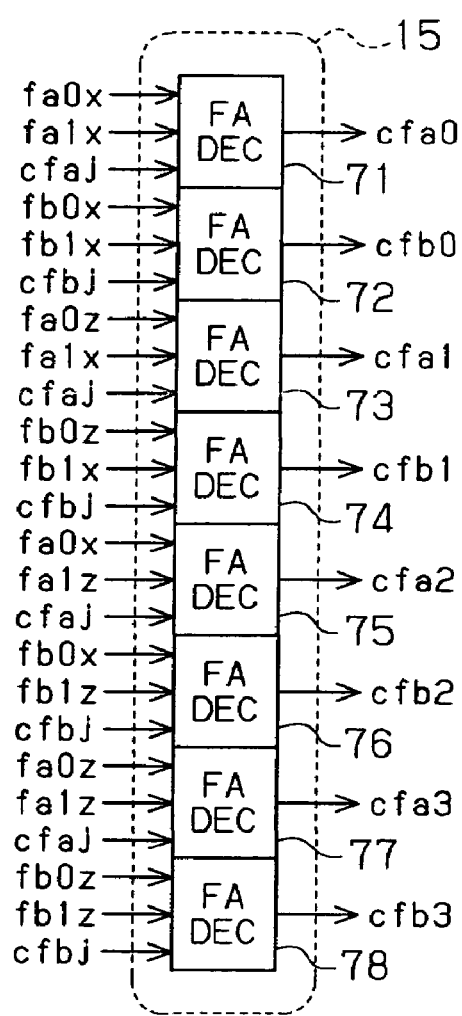
FIG. 8(a) is a schematic circuit diagram showing a fuse decoder circuit.

FIG. 8(a) is a schematic circuit diagram showing the fuse decoder circuit 15.

Figure 8B:
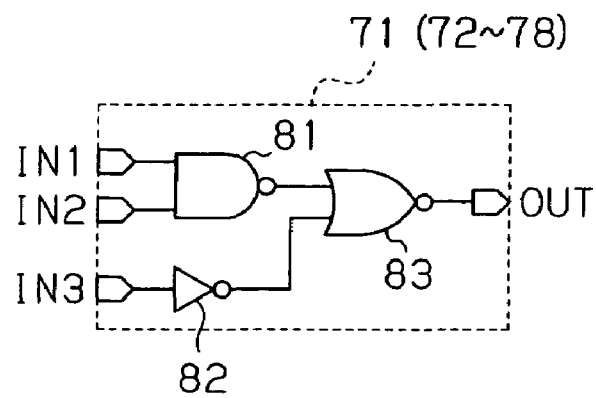
FIG. 8(b) is a circuit diagram of an FADEC.

As shown in FIG. 8(a), the fuse decoder circuit 15 includes FADECs 71 to 78 as fuse decoders. As shown in FIG. 8(b), each of the FADECs 71 to 78 includes a NAND circuit 81, an inverter circuit 82, and a NOR circuit 83.

The FADECs 71, 73, 75, and 77 are circuits for decoding the above first deficiency address. In detail, the FADECs 71, 73, 75, and 77 perform decoding based on one of the fuse signals fa0x and fa0z (IN1), one of the fuse signals fa1x and fa1z (IN2), and the fuse signal cfaj (IN3), to respectively output the decode signals cfa0 to cfa3 (OUT).

Also, the FADECs 72, 74, 76, and 78 are circuits for decoding the above second deficiency address. In detail, the FADECs 72, 74, 76, and 78 perform decoding based on one of the fuse signals fb0x and fb0z (IN1), one of the fuse signals fb1x and fb1z (IN2), and the fuse signal cfbj (IN3), to respectively generate the decode signals cfb0 to cfb3 (OUT).

Figure 8C:
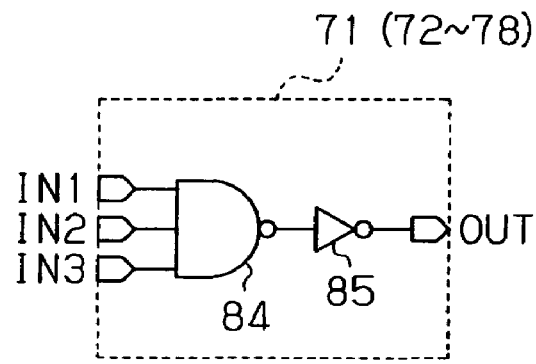
FIG. 8(c) is a circuit diagram showing another example of the FADEC.

Each of the FADECs 71 to 78 shown in FIG. 8(b) may be modified to have a structure including a three-input NAND circuit 84 and an inverter circuit 85 as shown in FIG. 8(c).

Figure 9A:
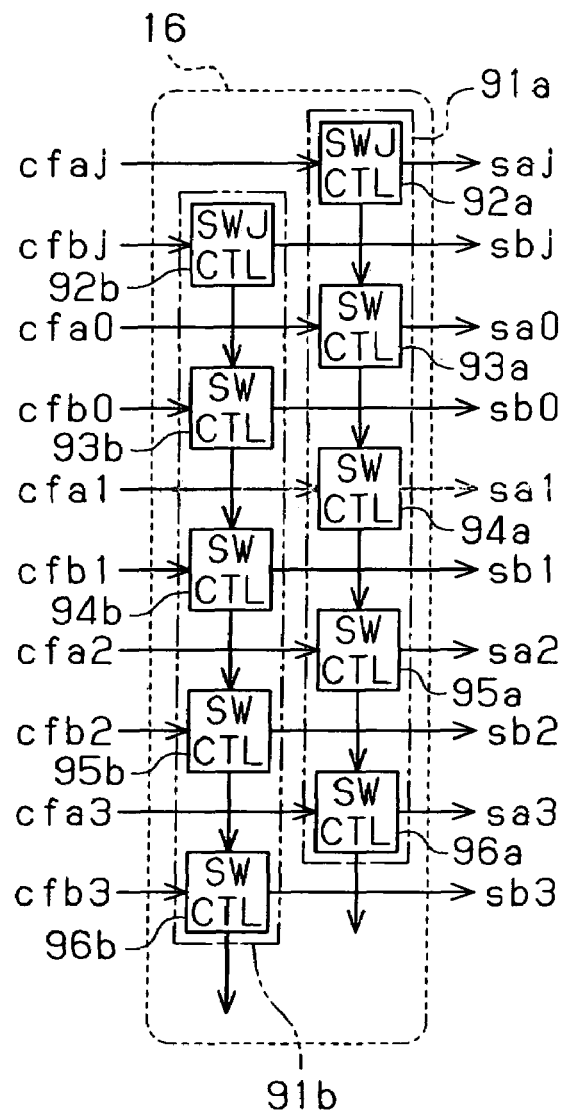
FIG. 9(a) is a schematic circuit diagram showing a shift control circuit.

FIG. 9(a) is a schematic circuit diagram showing the shift control circuit 16.

The shift control circuit 16 includes a first shift control circuit 91a, which is arranged for the memory block BLK1 having the first deficiency, and a second shift control circuit 91b, which is arranged for the memory block BLK2 having the second deficiency.

As shown in FIG. 9(a), the first shift control circuit 91a includes an SWJCTL 92a, which functions as a first switch control circuit, and a plurality of SWCTLs 93a, 94a, 95a, and 96a, which functions as second switch control circuits.

Figure 9B:
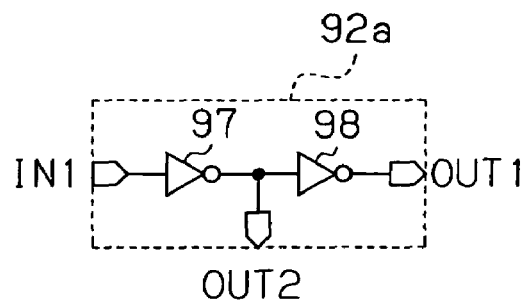
FIG. 9(b) is a circuit diagram of an SWJCTL.

As shown in FIG. 9(b), the SWJCTL 92a includes inverter circuits 97 and 98. The SWJCTL 92a generates a first shift signal saj (OUT1) and a control signal (OUT2) for controlling an output of the SWCTL 93a based on the fuse signal cfaj (IN1) input from the fuse signal amplification circuit 14.

Figure 9C:
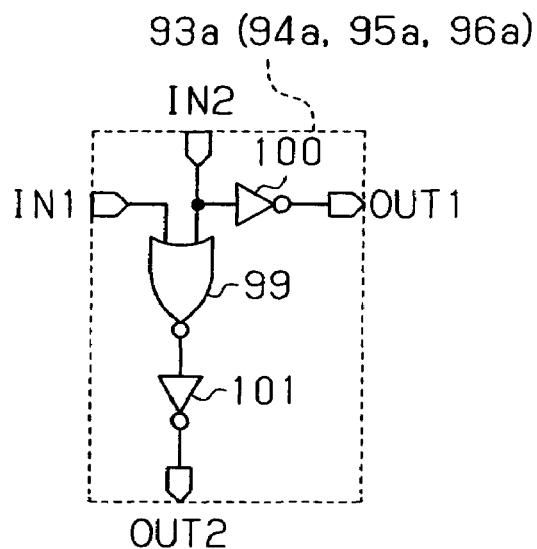
FIG. 9(c) is a circuit diagram of an SWCTL.

As shown in FIG. 9(c), the SWCTL 93a includes a NOR circuit 99 and inverter circuits 100 and 101. The SWCTL 93a generates a first shift signal sa0 (OUT1) based on a control signal (IN2) input from the SWJCTL 92a. The SWCTL 93a also generates a control signal (OUT2) for controlling an output of the SWCTL 94a based on the decode signal cfa0 (IN1) input from the fuse decoder circuit 15 and the control signal (IN2) input from the above SWJCTL 92a. The SWCTLs 94a, 95a, and 96a have the same structure as the structure of the SWCTL 93a and generate first shift signals sa1, sa2, and sa3, respectively.

The second shift control circuit 91b includes an SWJCTL 92b, which functions as a first switch control circuit, and a plurality of SWCTLs 93b, 94b, 95b, and 96b, which function as second switch control circuits.

The SWJCTL 92b has the same structure as the structure of the SWJCTL 92a shown in FIG. 9(b) and generates a second shift signal sbj. Also, the SWCTLs 93b, 94b, 95b, and 96b have the same structure as the structure of the SWCTLs 93a, 94a, 95a, and 96a shown in FIG. 9(c) and respectively generate second shift signals sb0, sb1, sb2, and sb3.

The following describes the shift signal selection circuit 17 and the memory block selection circuit 18.

The first shift signals saj, sa0, sa1, sa2, and sa3, the second shift signals sbj, sb0, sb1, sb2, and sb3, and the memory block selection signals ba0 and ba1 from the memory block selection circuit 18 are input into the shift signal selection circuit 17.

Figure 10A:
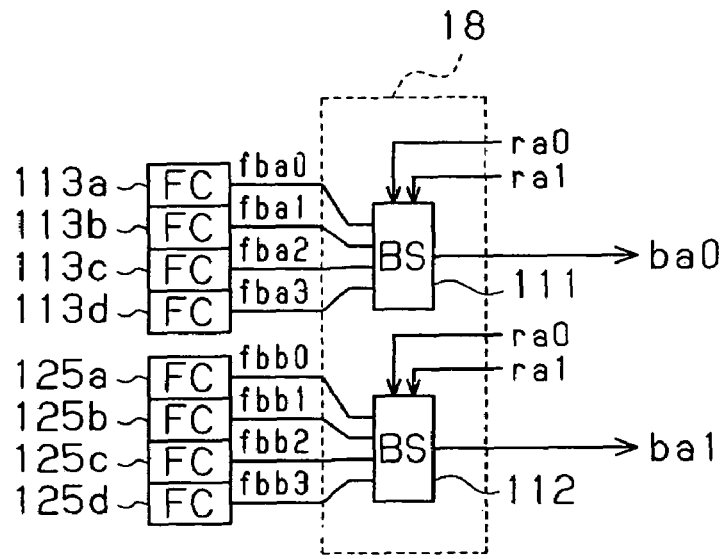
FIG. 10(a) is a schematic circuit diagram showing a memory block selection circuit.

As shown in FIG. 10(a), the memory block selection circuit 18 includes a first block selector 111, which is arranged for the memory block BLK1 having the first deficiency, and a second block selector 112, which is arranged for the memory block BLK2 having the second deficiency.

When the memory block BLK1 is selected based on the block address signals ra0 and ra1, the first block selector 111 sets the memory block selection signal ba0 active (at an H level) based on block selection information fba0 to fba3, which are held by fuse circuits (FCs) 113a to 113d.

Figure 10B:
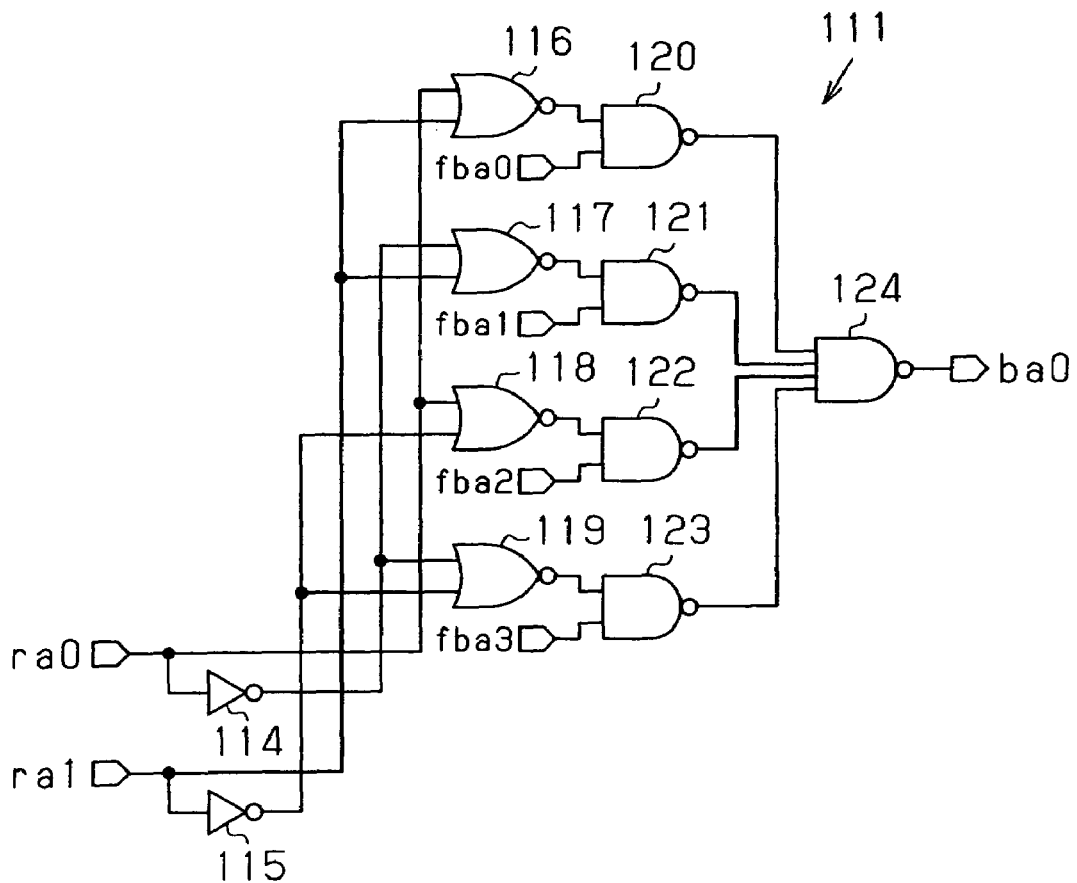
FIG. 10(b) is a circuit diagram of a block selector.
Figure 11:
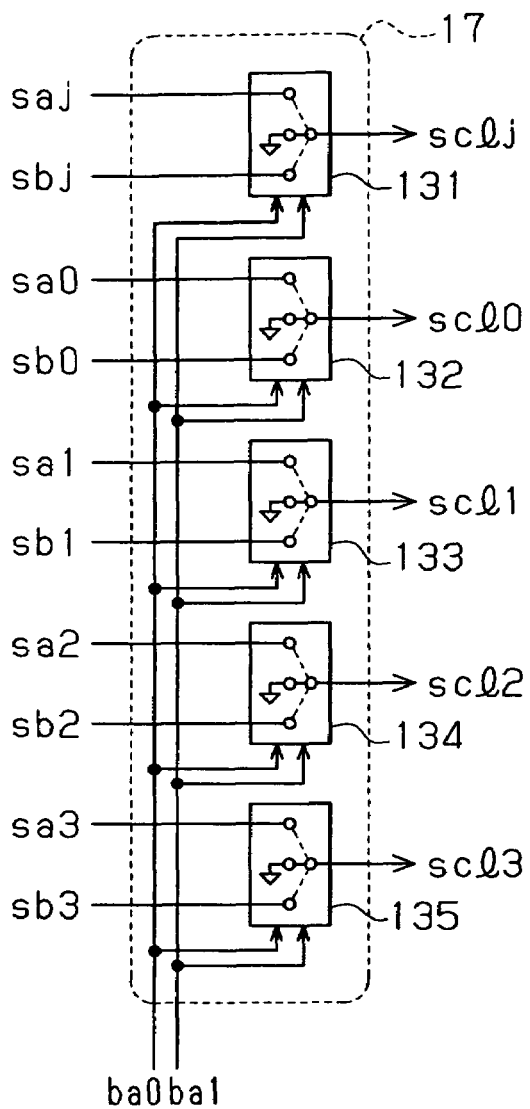
FIG. 11(a) is a schematic circuit diagram showing a shift signal selection circuit.
FIG. 11(b) shows a signal selection circuit.
Figure 11:
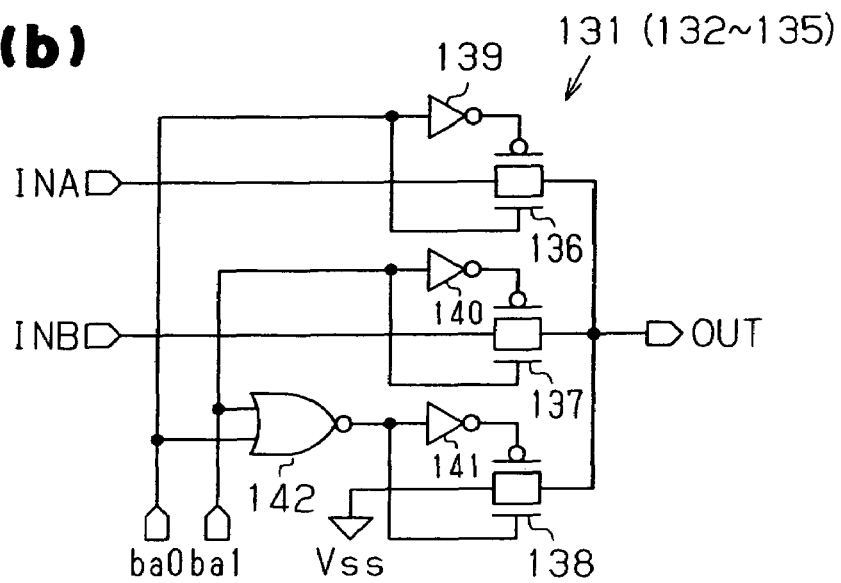

In detail, as shown in FIG. 10(b), the first block selector 111 includes inverter circuits 114 and 115, NOR circuits 116 to 119, and NAND circuits 120 to 124. The block address signals ra0 and ra1 are decoded by the NOR circuits 116 to 119, and the decoding results are input into one of the input terminals of the NAND circuits 120 to 123. The block selection information fba0 to fba3 are input into the other input terminals of the NAND circuits 120 to 123. The NAND circuit 124 logically synthesizes the output signals of the NAND circuits 120 to 123 and outputs the memory block selection signal ba0.

With this structure, when, for example, the memory block BLK1 is selected based on an H level block address signal ra0 and an L level block address signal ra1, the block selector 111 outputs an H level memory block signal ba0 based on H level block selection information fba1.

When the memory block BLK2 is selected based on the block address signals ra0 and ra1, the second block selector 112 sets the memory block selection signal ba1 active (at an H level) based on block selection information fbb0 to fbb3, which are held by fuse circuits (FCs) 125a to 125d. The second block selector 112 has the same structure as the structure of the first block selector 111 shown in FIG. 10(b). Thus, it will not be described in detail.

FIG. 11(a) is a schematic circuit diagram showing the shift signal selection circuit 17.

The shift signal selection circuit 17 includes signal selection circuits 131 to 135. As shown in FIG. 11(b), each of the signal selection circuits 131 to 135 includes transfer gates 136 to 138, inverter circuits 139 to 141, and a NOR circuit 142.

With this structure, when an H level memory block selection signal ba0 is input, the signal selection circuits 131 to 135 output the first shift signals saj and sa0 to sa3 (INA) as shift signals sclj and scl0 to scl3 (OUT), respectively. In other words, when the memory block BLK1 is selected and the memory block selection signal ba0 is set active, the shift signal selection circuit 17 selects, as the shift signals sclj and scl0 to scl3, the first shift signals saj and sa0 to sa3 corresponding to the first deficiency, which are output from the first shift control circuit 91a.

Also, when an H level memory block signal ba1 is input, the signal selection circuits 131 to 135 output the second shift signals sbj and sb0 to sb3 (INB) as shift signals sclj and scl0 to scl3 (OUT). In other words, when the memory block BLK2 is selected and the memory block selection signal ba1 is set active, the shift signal selection circuit 17 selects, as the shift signals sclj and scl0 to scl3, the second shift signals sbj and sb0 to sb3 corresponding to the second deficiency, which are output from the second shift control circuit 91b.

Also, when L level memory block signals ba0 and ba1 are input, the signal selection circuits 131 to 135 clamp the levels of the shift signals sclj and scl0 to cal3 (OUT) to a low-potential power supply Vss (e.g., to ground potential). In other words, when neither the memory block BLK1 nor BLK2 is selected, the shift signal selection circuit 17 sets the shift signals sclj and scl0 to scl3 all at an L level.

The operation of the shift redundancy circuit 10 with the above-described structure will now be described.

The first shift control circuit 91a outputs the first shift signals saj and sa0 to sa3, corresponding to the first deficiency address of the memory block BLK1, to the shift signal selection circuit 17. At that time, the states of the first shift signals saj and sa0 to sa3 are determined by the first deficiency address (address signals fa0 and fa1) and the first redundancy selection signal faj, and the first shift signals saj and sa0 to sa2 are set at an H level and the first shift signal sa3 is set at an L level.

The second shift control circuit 91b outputs the second shift signals sbj and sb0 to sb3, corresponding to the second deficiency address of the memory block BLK2, to the shift signal selection circuit 17. At that time, the states of the second shift signals sbj and sb0 to sb3 are determined by the second deficiency address (address signals fb0 and fb1) and the second redundancy selection signal fbj. In this case, the second shift signals sbj, sb0, and sb1 are set at an H level and the second shift signals sb2 and sb3 are set at an L level.

In this state, when the memory block BLK0 is first selected, the memory block selection signals ba0 and ba1 are both set at an L level because the memory block BLK0 has no deficiency. Thus, the shift signal selection circuit 17 clamps the shift signals sclj and scl0 to scl3 to ground potential (sets all at an L level).

The L level shift signals sclj and scl0 to scl3 cause the pre-column selection lines pcl0 to pcl3 to be connected to the column selection lines cl0 to cl3 by the selection line switches SW0 to SW3, respectively, and the redundancy column selection line rcl to be clamped to ground potential by the selection line switch RSW.

Next, when the memory block BLK1 is selected, the memory block selection signal ba0 is set at an H level and the memory block selection signal ba1 is set at an L level because the memory block BLK1 has a first deficiency. Thus, the shift signal selection circuit 17 selects, as the shift signals sclj and scl0 to scl3, the first shift signals saj and sa0 to sa3 corresponding to the first deficiency, which are output from the first shift control circuit 91a. The shift signal selection circuit 17 outputs H level shift signals sclj and scl0 to scl2 and an L level shift signal scl3.

The H level shift signals sclj and scl0 to scl2 and the L level shift signal scl3 cause the pre-column selection lines pcl0 to pcl2 to be connected to the redundancy column selection line rcl and the column selection lines cl0 and cl1 by the selection line switches SW0 to SW2, respectively, and the pre-column selection line pcl3 to be connected to the column selection line cl3 by the selection line switch SW3. The column selection line cl2 is not selected (connected to neither the pre-column selection line pcl2 nor pcl3).

Next, when the memory block BLK2 is selected, the memory block selection signal ba0 is set at an L level and the memory block selection signal ba1 is set at an H level because the memory block BLK2 has a second deficiency. Thus, the shift signal selection circuit 17 selects, as the shift signals sclj and scl0 to scl3, the second shift signals sbj and sb0 to sb3 corresponding to the second deficiency, which are output from the second shift control circuit 91b. The shift signal selection circuit 17 outputs H level shift signals sclj, scl0, and scl1, and L level shift signals scl2 and scl3.

The H level shift signals sclj, scl0, and scl1, and the L level shift signals scl2 and scl3 cause the pre-column selection lines pcl0 and pcl1 to be connected to the redundancy column selection line rcl and the column selection line cl0 by the selection line switches SW0 and SW1, respectively, and the pre-column selection lines pcl2 and pcl3 to be connected to the column selection lines cl2 and cl3 by the selection line switches SW2 and SW3 respectively. The column selection line cl1 is not selected (connected to neither the pre-column selection line pcl1 nor pcl2).

Next, when the memory block BLK3 is selected, the shift signal selection circuit 17 clamps the shift signals sclj and scl0 to scl3 to ground potential (sets all at an L level) because the memory block BLK3 has no deficiency, in the same manner as when the memory block BLK0 described above is selected.

The L level shift signals sclj and scl0 and scl3 cause the pre-column selection lines pcl0 to pcl3 to be connected to the column selection line cl0 to cl3 by the selection line switches SW0 and SW3, respectively, and the redundancy column selection line rcl to be clamped to ground potential by the selection line switch RSW.

In this shift redundancy circuit 10, the first and second shift control circuits 91a and 91b are enabled to respectively determine the states of the first shift signals saj and sa0 to sa3 and the states of the second shift signals sbj and sb0 to sb3 prior to selection of the memory blocks BLK0 to BLK3.

Thus, when the memory blocks BLK0 to BLK3 are switched, the shift signal selection circuit 17 selects, as the shift signals sclj and scl0 to scl3, the first shift signals saj and sa0 to sa3, the second shift signal sbj and sb0 to sb3, or the low-potential power supply Vss (clamped to ground potential). This enables the switching of the selection line switches RSW and SW0 to SW3 to be controlled, so that a deficiency is remedied by using redundancy. To be specific, when each of the memory blocks BLK0 to BLK3 is selected, the switching of the selection line switches RSW and SW0 to SW3 is controlled without requiring the shift control circuit 16 to operate.

As described above, the first embodiment has the effects described below.

(1) The states of the first shift signals saj and sa0 to sa3 are determined in advance by the first shift control circuit 91a, which is arranged for the memory block BLK1 having the first deficiency. The states of the second shift signals sbj and sb0 to sb3 are determined in advance by the second shift control circuit 91b, which is arranged for the memory block BLK2 having the second deficiency. With this structure, when each of the memory blocks BLK0 to BLK3 is selected, the switching of the selection line switches RSW and SW0 to SW3 is controlled without requiring the shift control circuit 16 to operate. This structure reduces operation current in the shift control circuit 16, and thereby reduces current consumption relating to the switching operation of the memory blocks BLK0 to BLK3.

(2) When the memory blocks BLK0 to BLK3 are switched, operation currents in the redundancy selection fuse circuit 13, the fuse signal amplification circuit 14, the fuse decoder circuit 15, etc., are also reduced.

(3) When the memory blocks BLK0 to BLK3 are switched, the shift signals sclj and scl0 to scl3 for controlling the switching of the selection line switches RSW and SW0 to SW3 are selected from the first shift signals saj and sa0 to sa3 whose states are determined in advance, the second shift signals sbj and sb0 to sb3 whose states are determined in advance, and the low-potential power supply Vss (clamped to ground potential). This shortens the time required for switching the selection line switches RSW and SW0 to SW3, and enables the switching operation of the memory blocks BLK0 to BLK3 to be executed at high speed.

Second Embodiment

A second embodiment of the present invention will now be described with reference to FIGS. 12 to 16b. In the second embodiment, in the same manner as in the first embodiment, a memory cell array AR is formed by four memory blocks BLK0 to BLK3, and it is assumed that the memory block BLK1 has a first deficiency and the memory block BLK2 has a second deficiency.

Figure 12:
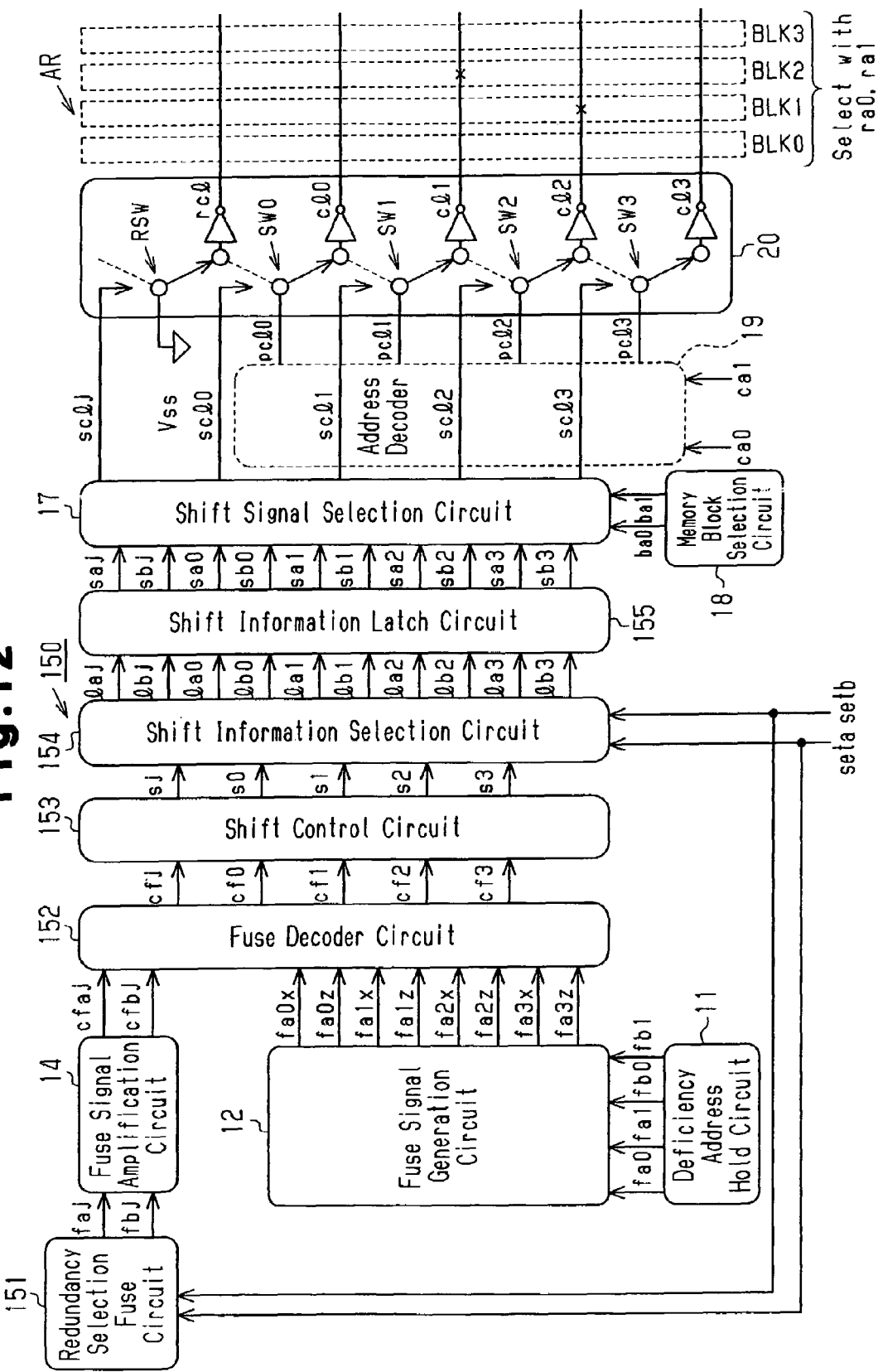
FIG. 12 is a schematic block diagram showing a shift redundancy circuit according to a second embodiment of the present invention.

FIG. 12 is a schematic block diagram showing a shift redundancy circuit 150 according to the second embodiment.

The shift redundancy circuit 150 has a structure based on the structure of the shift redundancy circuit 10 of the first embodiment, where the structures of the redundancy selection fuse circuit 13, the fuse decoder circuit 15, and the shift control circuit 16 are partially changed, and a shift information selection circuit 154 and a shift information latch circuit 155 are newly added. Thus, like or same reference numerals are given to those components that are the same as the corresponding components of the first embodiment, and such components will not be described in detail.

Figure 13A:
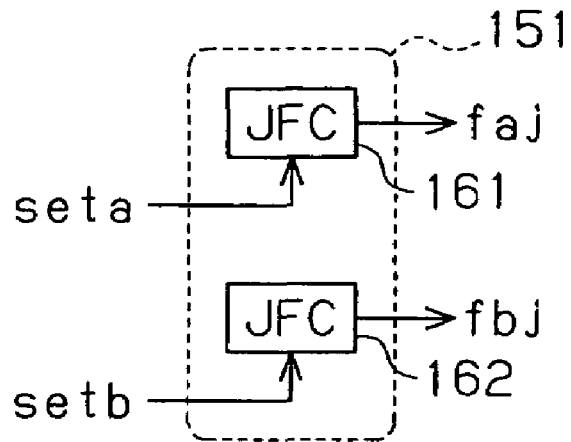
FIG. 13(a) is a schematic circuit diagram showing a redundancy selection fuse circuit according to the second embodiment of the present invention.

FIG. 13(a) is a schematic circuit diagram showing a redundancy selection fuse circuit 151 according to the second embodiment.

As shown in FIG. 13(a), the redundancy selection fuse circuit 151 includes a fuse circuit (JFC) 161 holding a first redundancy selection signal faj corresponding to the first deficiency of the memory block BLK1, and a fuse circuit (JFC) 162 holding a second redundancy selection signal fbj corresponding to the second deficiency of the memory block BLK2.

Figure 13B:
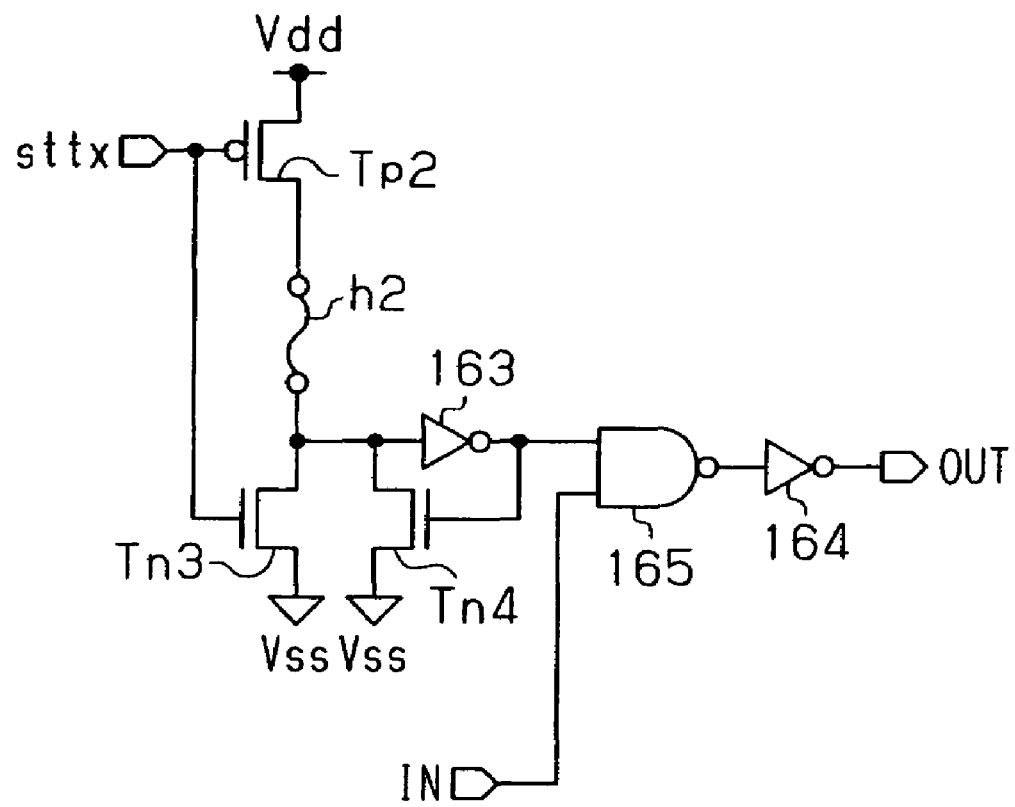
FIG. 13(b) is a circuit diagram of a fuse circuit.

As shown in FIG. 13(b), each of the fuse circuits 161 and 162 includes a PMOS transistor Tp2, NMOS transistors Tn3 and Tn4, a fuse h2, inverter circuits 163 and 164, and a NAND circuit 165. The fuse circuits 161 and 162 respectively set the first and second redundancy selection signals faj and fbj (OUT) active (at an H level) based on an H level start signal sttx and the corresponding H level set signals seta and setb (IN).

In the same manner as in the first embodiment, the redundancy selection signals faj and fbj output from the redundancy selection fuse circuit 151 are amplified by the fuse signal amplification circuit 14 and are generated as fuse signals cfaj and cfbj, respectively.

Figure 14:
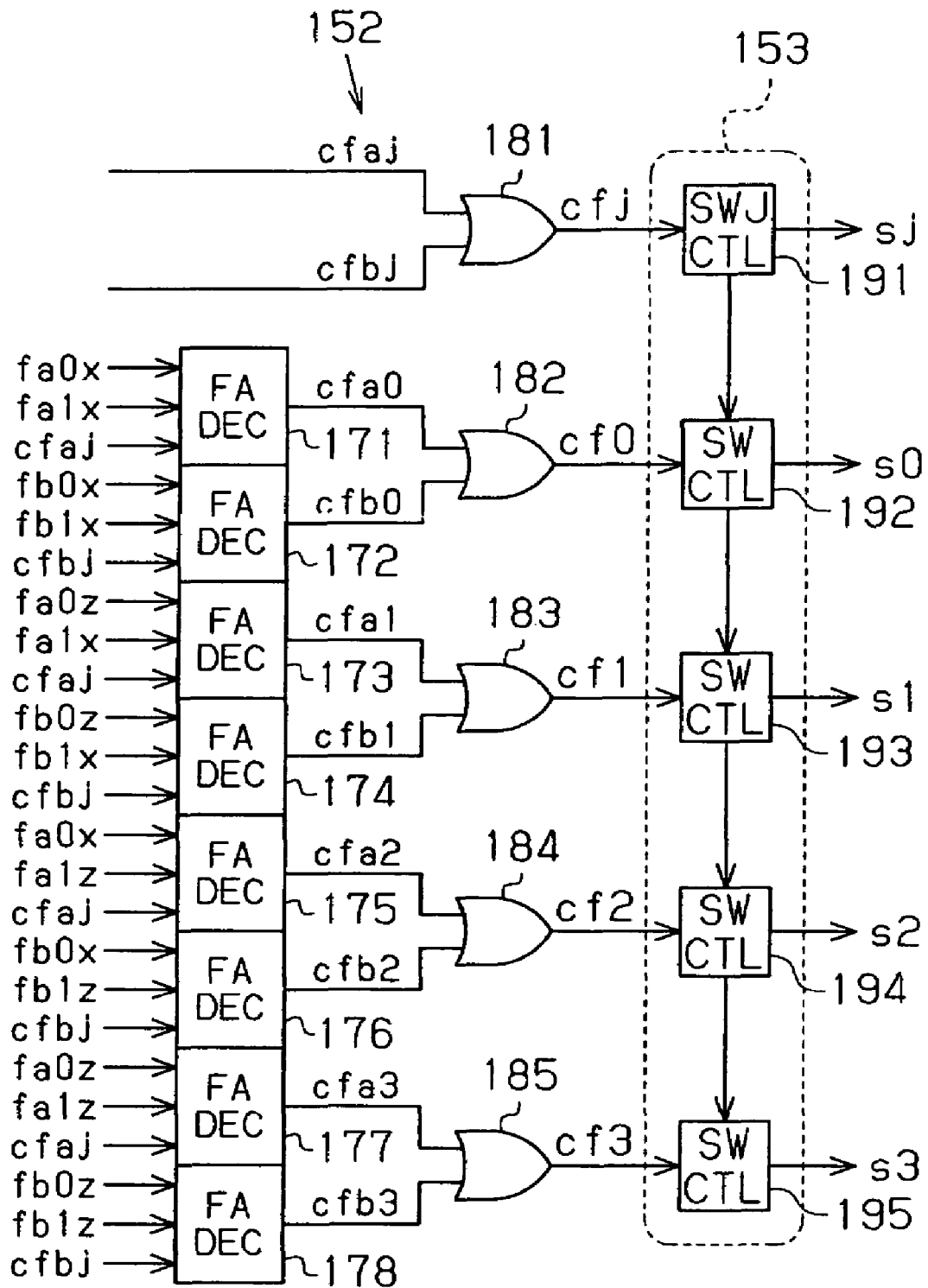
FIG. 14 is a schematic circuit diagram showing a fuse decoder circuit and a shift control circuit according to the second embodiment of the present invention.

FIG. 14 is a circuit diagram showing a fuse decoder circuit 152 and a shift control circuit 153 of the second embodiment.

The fuse decoder circuit 152 includes FADECs 171 to 178, which function as fuse decoders, and OR circuits 181 to 185, which function as logic synthesis circuits. Each of the FADECs 171 to 178 has the same structure as the structure of the FADECs 71 to 78 included in the fuse decoder circuit 15 according to the first embodiment (refer to FIGS. 8a to 8c).

The OR circuit 181 logically synthesizes the fuse signals cfaj and cfbj from the fuse signal amplification circuit 14 to generate a decode signal cfj. The OR circuit 182 logically synthesizes decode signals cfa0 and cfb0 from the FADECs 171 and 172 to generate a decode signal cf0. The OR circuit 183 logically synthesizes decode signals cfa1 and cfb1 from the FADECs 173 and 174 to generate a decode signal cf1. The OR circuit 184 logically synthesizes decode signals cfa2 and cfb2 from the FADECs 175 and 176 to generate a decode signal cf2. The OR circuit 185 logically synthesizes decode signals cfa3 and cfb3 from the FADECs 177 and 178 to generate a decode signal cf3.

The fuse decoder circuit 152 with this structure outputs, as the decode signals cfj and cf0 to cf3, signals resulting from decoding of the first deficiency address when the first redundancy selection signal faj is output from the redundancy selection fuse circuit 151 based on the set signal seta.

Also, the fuse decoder circuit 152 outputs, as the decode signals cfj and cf0 to cf3, signals resulting from decoding of the second deficiency address when the second redundancy selection signal fbj is output from the redundancy selection fuse circuit 151 based on the set signal setb.

The shift control circuit 153 includes an SWJCTL 191, which functions as a first switch control circuit, and SWCTLs 192 to 195, which function as second switch control circuits. The shift control circuit 153 has the same structure as the structure of the first shift control circuit 91a or the second shift control circuit 91b according to the first embodiment (refer to FIGS. 9a to 9c).

To be specific, the shift control circuit 153 of the present embodiment generates shift information sj and s0 to s3 by the corresponding SWJCTL 191 and SWCTLs 192 to 195, based on the decode signals cfj and cf0 to cf3 output from the above fuse decoder circuit 152.

Figure 15A:
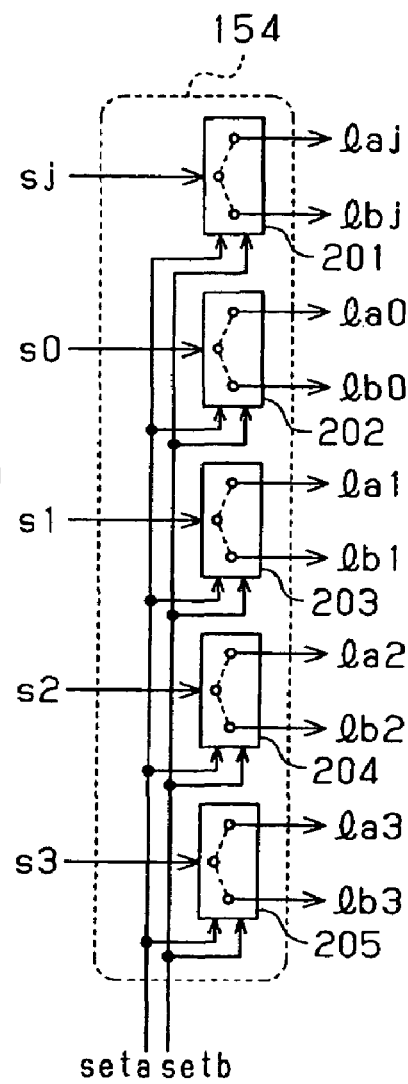
FIG. 15(a) is a schematic circuit diagram showing a shift information selection circuit.

FIG. 15(a) is a schematic circuit diagram showing the shift information selection circuit 154.

Figure 15B:
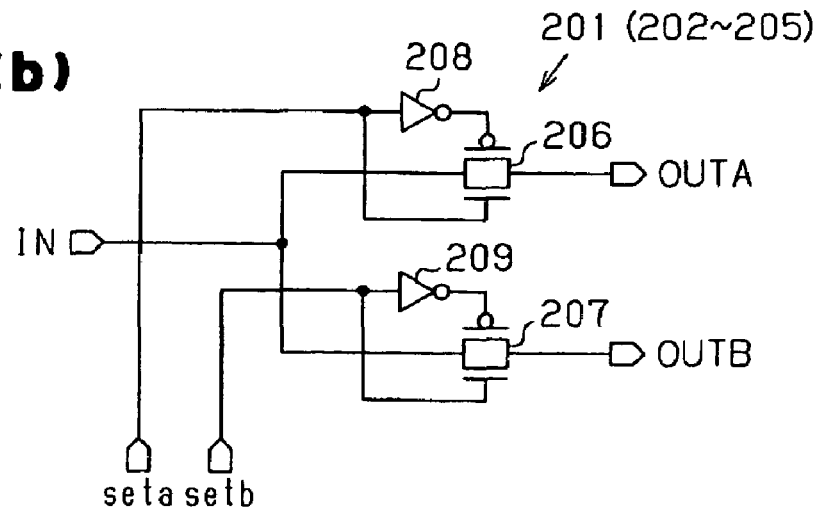
FIG. 15(b) is a circuit diagram of a signal selection circuit.

As shown in FIG. 15(a), the shift information selection circuit 154 includes signal selection circuits 201 to 205. As shown in FIG. 15(b), each of the signal selection circuits 201 to 205 includes transfer gates 206 and 207, and inverter circuits 208 and 209. The above set signals seta and setb and the corresponding shift information sj and s0 to s3 (IN) from the shift control circuit 153 are input into the signal selection circuits 201 to 205.

With this structure, if the first redundancy selection signal faj is generated when the set signal seta is set active (at an H level), the signal selection circuits 201 to 205 output, as latch information laj and la0 to la3 (OUTA), the shift information sj and s0 to s3 (IN) corresponding to the first deficiency address.

Also, if the second redundancy selection signal fbj is generated when the set signal setb is set active (at an H level), the signal selection circuits 201 to 205 output, as latch information lbj and lb0 to lb3 (OUTB), the shift information sj and s0 to s3 (IN) corresponding to the second deficiency address.

Figure 16A:
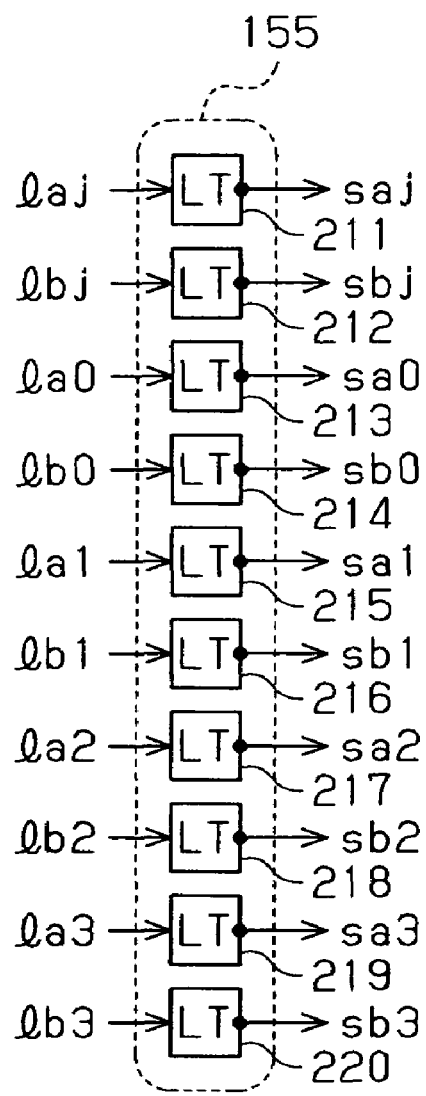
FIG. 16(a) is a schematic circuit diagram showing a shift information latch circuit.

FIG. 16(a) is a schematic circuit diagram showing the shift information latch circuit 155.

Figure 16B:
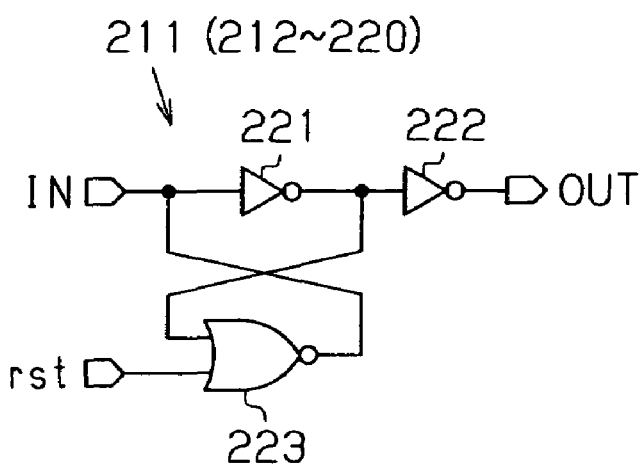
FIG. 16(b) is a circuit diagram of a latch circuit.

As shown in FIG. 16(a), the shift information latch circuit 155 includes latch circuits 211 to 220. As shown in FIG. 16(b), each of the latch circuits 211 to 220 includes inverter circuits 221 and 222 and a NOR circuit 223.

The latch circuits 211, 213, 215, 217, and 219 latch the latch information laj and la0 to la3 (IN) corresponding to the first deficiency address, which are output from the signal selection circuits 201 to 205. Then, the latch circuits 211, 213, 215, 217, and 219 output the latched information laj and la0 to la3 as the first shift signals saj and sa0 to sa3, respectively.

The latch circuits 212, 214, 216, 218, and 220 latch the latch information lbj and lb0 to lb3 (IN) corresponding to the second deficiency address, which are output from the signal selection circuits 201 to 205, and output the latched information sets as the second shift signals sbj and sb0 to sb3, respectively. Each of the latch circuits 211 to 220 is reset based on an H level reset signal rst. When the latch circuits 212, 214, 216, 218, and 220 are reset, the set signals seta and setb input into the signal selection circuits 201 to 205 are both inactive (at an L level), and the outputs of the signal selection circuits 201 to 205 are disconnected.

The operation of the shift redundancy circuit 150 with the above-described structure will now be described.

An active (H level) set signal seta is generated so that an H level first redundancy selection signal faj is output from the redundancy selection fuse circuit 151. The H level set signal seta causes the shift information selection circuit 154 to output, as the latch information laj and la0 to la3, the shift information sj and s0 to s3 corresponding to the first deficiency address output from the shift control circuit 153. Then, the shift information latch circuit 155 latches the latch information laj and la0 to la3, and outputs the first shift signals saj and sa0 to sa3 to the shift signal selection circuit 17.

At that time, the states of the first shift signals saj and sa0 to sa3 are determined by the first deficiency address (address signals fa0 and fa1) and the first redundancy selection signal faj. In this case, the first shift signals saj and sa0 to sa2 are set at an H level, and the first shift signal sa3 is set at an L level.

When an active (H level) set signal setb is generated, an H level second redundancy selection signal fbj is output from the redundancy selection fuse circuit 151. The H level set signal setb causes the shift information selection circuit 154 to output, as the latch information lbj and lb0 to lb3, the shift information sj and s0 to s3 corresponding to the second deficiency address, which are output from the shift control circuit 153. Then, the shift information latch circuit 155 latches the latch information lbj and lb0 to lb3, and outputs the second shift signals sbj and sb0 to sb3 to the shift signal selection circuit 17.

At that time, the states of the second shift signals sbj and sb0 to sb3 are determined by the second deficiency address (address signals fb0 and fb1) and the second redundancy selection signal fbj. In this case, the second shift signals sbj, sb0, and sb1 are set at an H level, and the second shift signals sb2 and sb3 are set at an L level.

In this state, when the memory block BLK0 is first selected, the memory block selection signals ba0 and ba1 are both set at an L level because the memory block BLK0 has no deficiency. Thus, the shift signal selection circuit 17 clamps the shift signals sclj and scl0 to scl3 to ground potential (all set at an L level).

The L level shift signals sclj and scl0 to scl3 cause the pre-column selection lines pcl0 to pcl3 to be connected to the column selection lines cl0 to cl3 by the selection line switches SW0 to SW3, respectively, and the redundancy column selection line rcl to be clamped to ground potential by the selection line switch RSW.

Next, when the memory block BLK1 is selected, the memory block selection signal ba0 is set at an H level and the memory block selection signal ba1 is set at an L level because the memory block BLK1 has a first deficiency. Thus, the shift signal selection circuit 17 selects, as the shift signals sclj and scl0 to scl3, the first shift signals saj and sa0 to sa3 corresponding to the first deficiency address, which are output from the latch circuits 211, 213, 215, 217, and 219, respectively. The shift signal selection circuit 17 outputs H level shift signals sclj and scl0 to scl2 and an L level shift signal scl3.

The H level shift signals sclj and scl0 to scl2 and the L level shift signal scl3 cause the pre-column selection lines pcl0 to pcl2 to be connected to the redundancy column selection line rcl and the column selection lines cl0 and cl1 by the selection line switches SW0 to SW2, respectively, and the pre-column selection line pcl3 to be connected to the column selection line cl3 by the selection line switch SW3. The column selection line cl2 is not selected (connected to neither the pre-column selection line pcl2 nor pcl3).

Next, when the memory block BLK2 is selected, the memory block selection signal ba0 is set at an L level and the memory block selection signal ba1 is set at an H level because the memory block BLK2 has a second deficiency. Thus, the shift signal selection circuit 17 selects, as the shift signals sclj and scl0 to scl3, the second shift signals sbj and sb0 to sb3 corresponding to the second deficiency address, which are output from the latch circuits 212, 214, 216, 218, and 220, respectively. The shift signal selection circuit 17 outputs H level shift signals sclj, scl0, and scl1, and L level shift signals scl2 and scl3.

The H level shift signals sclj, scl0, and scl1, and the L level shift signals scl2 and scl3 cause the pre-column selection lines pcl0 and pcl1 to be connected to the redundancy column selection line rcl and the column selection line cl0 by the selection line switches SW0 and SW1, respectively, and the pre-column selection lines pcl2 and pcl3 to be connected to the column selection lines cl2 and cl3 by the selection line switches SW2 and SW3, respectively. The column selection line cl1 is not selected (connected to neither the pre-column selection line pcl1 nor pcl2).

Next, when the memory block BLK3 is selected, the shift signal selection circuit 17 clamps the shift signals sclj and scl0 to scl3 to ground potential (sets all at an L level) because the memory block BLK3 has no deficiency, in the same manner as when the memory block BLK0 described above is selected.

The L level shift signals sclj and scl0 to scl3 cause the pre-column selection lines pcl0 to pcl3 to be connected to the column selection lines cl0 to cl3 by the selection line switches SW0 to SW3, respectively, and the redundancy column selection line rcl to be clamped to ground potential by the selection line switch RSW.

In the same manner as in the first embodiment, in the shift redundancy circuit 150, the states of the first shift signals saj and sa0 to sa3 and the states of the second shift signals sbj and sb0 to sb3 are determined prior to selection of the memory blocks BLK0 to BLK3, and the first shift signals saj and sa0 to sa3 and the second shift signals sbj and sb0 to sb3 whose states are determined in advance are latched by the shift information latch circuit 155.

Thus, when the memory blocks BLK0 to BLK3 are switched, the shift signal selection circuit 17 selects, as the shift signals sclj and scl0 to scl3, the first shift signals saj and sa0 to sa3, the second shift signals sbj and sb0 to sb3, or the low-potential power supply Vss (clamped to ground potential). This enables the switching of the selection line switches RSW and SW0 to SW3 to be controlled so that a deficiency is remedied by using redundancy. To be specific, when each of the memory blocks BLK0 to BLK3 is selected, the switching of the selection line switches RSW and SW0 to SW3 is controlled without requiring the shift control circuit 153 to operate.

The second embodiment has the advantages described below.

(1) The shift information latch circuit 155 latches the first shift signals saj and sa0 to sa3 and the second shift signals sbj and sb0 to sb3 based on the set signals seta and setb. The shift information latch circuit 155 enables, when each of the memory blocks BLK0 to BLK3 is selected, the switching of the selection line switches RSW and SW0 to SW3 to be controlled without requiring the shift control circuit 153 to operate. This structure reduces an operation current in the shift control circuit 153, and thereby reduces current consumption relating to the switching operation of the memory blocks BLK0 to BLK3.

(2) When the memory blocks BLK0 to BLK3 are switched, operation currents in the redundancy selection fuse circuit 151, the fuse signal amplification circuit 14, the fuse decoder circuit 152, etc., are also reduced.

(3) When the memory blocks BLK0 to BLK3 are switched, the shift signals sclj and scl0 to scl3 for controlling the switching of the selection line switches RSW and SW0 to SW3 are selected from the first shift signals saj and sa0 to sa3 whose states are determined in advance, the second shift signals sbj and sb0 to sb3 whose states are determined in advance, and the low-potential power supply Vss (clamped to ground potential). This shortens the time required for switching the selection line switches RSW and SW0 to SW3, and enables the switching operation of the memory blocks BLK0 to BLK3 to be executed at high speed.

It should be apparent to those skilled in the art that the present invention may be embodied in many other specific forms without departing from the spirit or scope of the invention. Particularly, it should be understood that the present invention may be embodied in the following forms.

In the above embodiments, the shift redundancy scheme involves shifting, using redundancy in one direction, where the redundancy column selection line rcl is arranged at one end of the column selection lines cl0 to cl3. However, the shift redundancy scheme may be such a scheme that involves shifting, using redundancy in two directions, where two redundancy column selection lines are respectively arranged at the two ends of the column selection lines cl0 to cl3. This two-direction shift redundancy scheme also enables deficiency remedy of a memory block having two deficient locations.

The present examples and embodiments are to be considered as illustrative and not restrictive, and the invention is not to be limited to the details given herein, but may be modified within the scope and equivalence of the appended claims.

What is claimed is:

1. A method for controlling a shift redundancy circuit that selectively connects a plurality of selection lines and at least one redundancy selection line, each of which commonly shares a plurality of memory blocks, to a plurality of decode selection lines, and remedies a deficiency relating to each of the plurality of selection lines for each memory block, the method comprising the steps of:

decoding a deficiency address indicating a deficient location to generate a decode signal;

generating a shift signal for determining the plurality of decode selection lines to be selectively connected to the plurality of selection lines and the at least one redundancy selection line based on the decode signal for each memory block having a deficiency to be remedied;

selecting a shift signal corresponding to a selected memory block having a deficiency to be remedied based on a memory block selection signal; and selectively connecting the plurality of decode selection lines to the plurality of selection lines and the at least one redundancy selection line based on the selected shift signal.

2. The method for controlling a shift redundancy circuit according to claim 1, wherein the step for generating a decode signal includes decoding the deficiency address based on a redundancy selection signal to generate a decode signal.

3. The method for controlling a shift redundancy circuit according to claim 1, wherein the step for generating a decode signal includes decoding the deficiency address for each memory block having a deficiency to be remedied to generate a decode signal.

4. The method for controlling a shift redundancy circuit according to claim 1, further comprising:

the step of clamping the shift signal to a predetermined power supply potential so that the plurality of decode selection lines are respectively connected to the plurality of selection lines when no memory block having a deficiency to be remedied is selected based on the memory block selection signal.

5. The method for controlling a shift redundancy circuit according to claim 1, further comprising the step of:

generating memory block selection signals so that the number of the memory block selection signals corresponds to the number of memory blocks having a deficiency to be remedied.

6. The method for controlling a shift redundancy circuit according to claim 1, further comprising the step of:

generating the memory block selection signal based on a decoding result of a block address signal and block selection information corresponding to the block address signal.

7. A shift redundancy circuit for selectively connecting a plurality of selection lines and at least one redundancy selection line, each of which commonly shares a plurality of memory blocks, to a plurality of decode selection lines, and remedying a deficiency relating to each of the plurality of selection lines for each memory block, the circuit comprising:

a shift control circuit for generating a shift signal for determining the plurality of decode selection lines to be selectively connected to the plurality of selection lines and the at least one redundancy selection line based on a deficiency address indicating a deficient location and a redundancy selection signal for selecting the redundancy selection line for each memory block having a deficiency to be remedied;

a shift signal selection circuit, connected to the shift control circuit, for selecting a shift signal corresponding to a selected memory block having a deficiency to be remedied based on a memory block selection signal; and a switch circuit, connected to the shift signal selection circuit, for selectively connecting the plurality of decode selection lines to the plurality of selection lines and the at least one redundancy selection line based on the shift signal selected by the shift signal selection circuit.

8. The shift redundancy circuit according to claim 7, wherein the shift control circuit includes a plurality of shift control circuits, the number of the shift control circuits corresponding to the number of memory blocks having a deficiency to be remedied.

9. The shift redundancy circuit according to claim 7, further comprising:

a deficiency address hold circuit for holding the deficiency address for each memory block having a deficiency to be remedied; and a redundancy selection signal generation circuit for holding the redundancy selection signal for each memory block having a deficiency to be remedied.

10. The shift redundancy circuit according to claim 7, wherein:

the switch circuit includes a plurality of selection line switches, corresponding to the plurality of selection lines, and at least one redundancy selection line switch, corresponding to the at least one redundancy selection line; and the shift control circuit includes a first switch control circuit, for controlling the at least one redundancy selection line switch, and a plurality of second switch control circuits, for respectively controlling the plurality of selection line switches.

11. The shift redundancy circuit according to claim 7, wherein the shift signal selection circuit includes a means for clamping the shift signal to a predetermined power supply potential so that the plurality of decode selection lines are respectively connected to the plurality of selection lines when no memory block having a deficiency to be remedied is selected based on the memory block selection signal.

12. A semiconductor memory device comprising:

a plurality of memory blocks;

a plurality of selection lines and at least one redundancy selection line, each of which commonly shares the plurality of memory blocks;

a plurality of decode selection lines; and a shift redundancy circuit for selectively connecting the plurality of selection lines and the at least one redundancy selection line to the plurality of decode selection lines, and remedying a deficiency relating to each of the plurality of selection lines for each memory block, wherein the shift redundancy circuit includes:

a shift control circuit for generating, for each memory block having a deficiency to be remedied, a shift signal for determining the plurality of decode selection lines to be selectively connected to the plurality of selection lines and the at least one redundancy selection line based on a deficiency address indicating a deficient location and a redundancy selection signal for selecting the redundancy selection line;

a shift signal selection circuit, connected to the shift control circuit, for selecting a shift signal corresponding to a selected memory block having a deficiency to be remedied based on a memory block selection signal; and a switch circuit, connected to the shift signal selection circuit, for selectively connecting the plurality of decode selection lines to the plurality of selection lines and the at least one redundancy selection line based on the shift signal selected by the shift signal selection circuit.

* * * * *